(12) United States Patent
Shinriki et al.

(10) Patent No.: US 6,232,248 B1
(45) Date of Patent: May 15, 2001

(54) SINGLE-SUBSTRATE-HEAT-PROCESSING METHOD FOR PERFORMING REFORMATION AND CRYSTALLIZATION

(75) Inventors: Hiroshi Shinriki, Kofu; Masahito Sugiura, Nirasaki, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/335,526

(22) Filed: Jun. 18, 1999

(30) Foreign Application Priority Data

Jul. 3, 1998 (JP) .................................................. 10-204502
Sep. 10, 1998 (JP) .................................................. 10-274353

(51) Int. Cl.[7] ........................... H01L 21/31; H01L 21/469
(52) U.S. Cl. .......................... 438/785; 438/680; 438/681; 438/685
(58) Field of Search ...................................... 438/653, 654, 438/656, 680, 681, 685, 785, 907, 908

(56) References Cited

U.S. PATENT DOCUMENTS

| 5,468,687 | * | 11/1995 | Carl et al. . | |
| 6,122,566 | * | 9/2000 | Nguyen et al. | 700/218 |
| 6,133,086 | * | 10/2000 | Huang et al. | 438/240 |
| 6,143,081 | * | 11/2000 | Shinriki et al. | 118/719 |
| 6,162,744 | * | 12/2000 | Al-Shareef et al. | 438/785 |

FOREIGN PATENT DOCUMENTS

| 2-283022 | 11/1990 | (JP) . |
| 9-121035 | 5/1997 | (JP) . |
| 10-79377 | 3/1998 | (JP) . |

* cited by examiner

Primary Examiner—Gregory Mills
Assistant Examiner—Luz L. Alejandro
(74) Attorney, Agent, or Firm—Oblon, Spivak, McLelland, Maier & Neustadt, P.C.

(57) ABSTRACT

An insulating film consisting of first and second tantalum oxide layers is formed on a semiconductor wafer. First, an amorphous first layer is formed by CVD, and a reforming process for removing organic impurities contained in the first layer is carried out. Then, an amorphous second layer is formed by CVD on the first layer. Then, a reforming process for removing organic impurities contained in the second layer is carried out by supplying a process gas containing ozone into a process chamber while heating the wafer to a temperature lower than a crystallizing temperature over a certain period. Further, within the same process chamber, the wafer is successively heated to a second temperature higher than the crystallizing temperature, followed by cooling the wafer to a temperature lower than the crystallizing temperature so as to crystallize the first and second layers simultaneously.

20 Claims, 12 Drawing Sheets

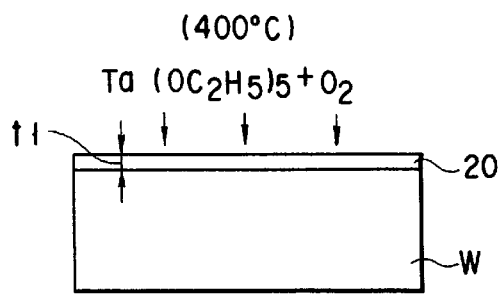
F I G. 2A
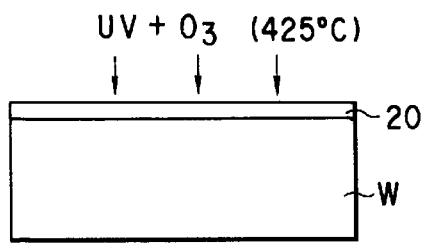
F I G. 2B
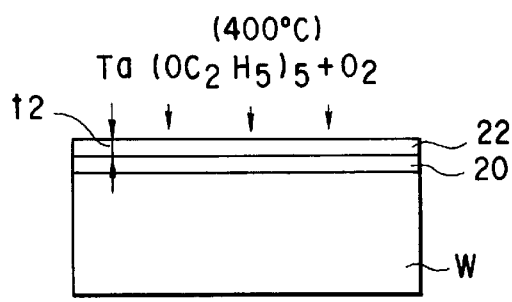
F I G. 2C
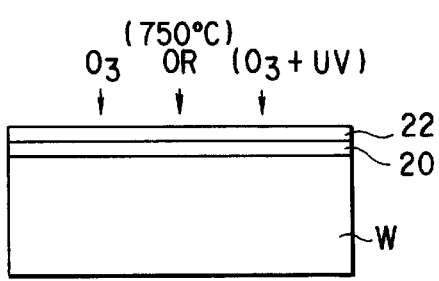
F I G. 2D
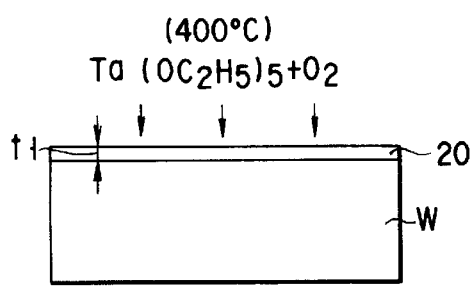
F I G. 5A
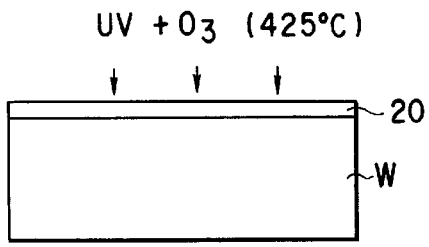
F I G. 5B
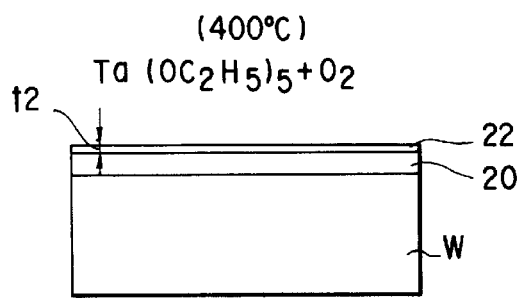
F I G. 5C
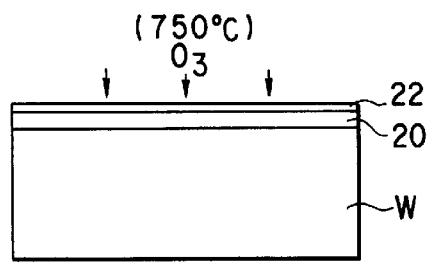
F I G. 5D

SINGLE-SUBSTRATE-HEAT-PROCESSING METHOD FOR PERFORMING REFORMATION AND CRYSTALLIZATION

BACKGROUND OF THE INVENTION

The present invention relates to a single-substrate-heat-processing apparatus and method for performing a reforming process for removing inorganic impurities contained in a thin film formed on a target substrate and for performing a crystallizing process for crystallizing the thin film, and particularly, to a heat processing apparatus and method applied to a metal oxide film deposited by MOCVD (Metal Organic Chemical Vapor Deposition) method.

In the manufacturing process of a semiconductor device, a film forming process and a pattern etching process are repeatedly applied to a semiconductor wafer. The specification for the film forming process becomes severer and severer in recent years in accordance with increases in the density and in the degree of integration of the semiconductor devices. For example, a further a decrease in thickness and a higher insulating properties are required even for a very thin insulating film such as an insulating film included in a capacitor or a gate insulating film.

A silicon oxide film or a silicon nitride film is widely used as such an insulating film. However, a metal oxide film such as a tantalum oxide ($Ta_2O_5$) film has come to be used in recent years as an insulating film exhibiting further improved insulating properties. Such a metal oxide film can be formed by an MOCVD method, in which an organometallic compound is gasified for deposition of the metal. The insulating properties of the metal oxide film can be further improved by applying a reforming process to the surface of the metal oxide film after deposition. A reforming processing technique is disclosed in, for example, Jpn. Pat. Appln. KOKAI Publication No. 2-283022.

A CVD apparatus is used for forming a tantalum oxide film. A raw material gas containing, for example, tantalum alkoxide ($Ta(OC_2H_5)_5$) is used as a process gas together with $O_2$ gas. The process pressure is set at about 0.2 to 0.3 Torr, and the process temperature is set at about 250 to 450° C. Under these conditions, the excited species generated by dissociation of the raw material gas perform reactions with the oxygen gas, with the result that an amorphous tantalum oxide film is deposited on a semiconductor wafer.

A reforming apparatus is used for performing the reforming process of the tantalum oxide film after the deposition. The wafer having the tantalum oxide film formed thereon is put under an atmosphere of the atmospheric pressure containing ozone. Ozone is irradiated with ultraviolet rays emitted from a mercury lamp so as to generate active oxygen atoms. The organic impurities having C—C bonds, etc. and contained in the tantalum oxide film are decomposed by the active oxygen atoms so as to be removed from the tantalum oxide film. As a result, the insulating properties of the tantalum oxide film are improved. Incidentally, the reforming process is carried out at a temperature lower than the crystallizing temperature, e.g., at about 425° C., in order to allow the tantalum oxide film to maintain its amorphous state.

Then, the wafer is transferred into a heat processing apparatus for crystallization. The tantalum oxide film is heated within the heat processing apparatus in the presence of $O_2$ gas to a temperature higher than the crystallizing temperature, e.g., to about 700° C. By this annealing process, the tantalum oxide film is crystallized and the density thereof is increased in the molecule level, with the result that the insulating properties of the tantalum oxide film are further improved.

Jpn. Pat. Appln. KOKAI Publication No. 9-121035 teaches a tantalum oxide film of a two-layer structure. In this prior art, an amorphous first layer is deposited first on a semiconductor wafer, followed by applying a reforming process to the first layer. Then, a second amorphous layer is deposited on the first layer, followed by applying a reforming process to the second layer. Finally, the wafer is subjected to a heat process at a high temperature so as to crystallize both the first and second layers simultaneously. The technique disclosed in this prior art makes it possible to remove effectively the organic impurities in the step of the individual reforming process because each of the first and second layers is sufficiently thin so as to further improve the insulating properties of the tantalum oxide film. However, the number of the process steps and the number of transfer steps are increased in this prior art, leading to a decrease in the through-put. In addition, the facility cost and the manufacturing cost are increased.

Further, Jpn. Pat. Appln. KOKAI Publication No. 10-79377 (U.S. patent application Ser. No. 08/889,590, now U.S. Pat. No. 6,143,081) relating to an invention achieved by the present inventors discloses a cluster-tool-type film forming system in which a deposition apparatus, a reforming apparatus and a heat processing apparatus for crystallization are connected to each other via a common transfer chamber. The cluster-tool-type film forming system permits solving the problem of the through-put, etc. to some extent. However, a further improvement is required.

BRIEF SUMMARY OF THE INVENTION

An object of the present invention is to provide a single-substrate-heat-processing apparatus and method for performing a reforming process and a crystallizing process while increasing the through-put and reducing the facility cost and the manufacturing cost.

According to a first aspect of the present invention, there is provided a single-substrate-heat-processing apparatus for performing a reforming process for removing organic impurities contained in a thin film formed on a target substrate and a crystallizing process for crystallizing the thin film, the thin film being formed of a material selected from the group consisting of metal oxides, metal nitrides and metals, the apparatus comprising:

an airtight process chamber;

a work table arranged within the process chamber configured to place the target substrate thereon;

an exhaust mechanism configured to exhaust the process chamber;

a supply mechanism configured to supply a process gas containing oxygen atoms into the process chamber;

a heating mechanism configured to heat the thin film while the target substrate is placed on the work table; and a control section configured to serve to control the heating mechanism such that the thin film is heated to a first temperature lower than the crystallizing temperature of the material over a first period and, then, the thin film is heated to a second temperature higher than the crystallizing temperature, followed by cooling the thin film to a temperature lower than the crystallizing temperature, the first period being longer than a second period during which the thin film has a temperature higher than the crystallizing temperature.

According to a second aspect of the present invention, there is provided a film forming system for forming a crystallized thin film on a target substrate, the thin film being formed of a material selected from the group consisting of metal oxides, metal nitrides and metals, the system comprising:

an airtight common transfer chamber;
a transfer mechanism arranged within the common transfer chamber configured to transfer the target substrate;
a single-substrate-processing CVD apparatus connected to the common transfer chamber via a gate valve, configured to deposit an amorphous thin film by CVD on the target substrate; and
a single-substrate-heat-processing apparatus connected to the common transfer chamber configured to perform a reforming process for removing organic impurities contained in the thin film and a crystallizing process for crystallizing the thin film, the heat-processing apparatus including,
an airtight process chamber,
a work table arranged within the process chamber configured to place the target substrate thereon,
an exhaust mechanism configured to exhaust the process chamber,
a supply mechanism configured to supply a process gas containing oxygen atoms into the process chamber,
a heating mechanism configured to heat the thin film while the target substrate is placed on the work table, and
a control section configured to serve to control the heating mechanism such that the thin film is heated to a first temperature lower than the crystallizing temperature of the material over a first period and, then, the thin film is heated to a second temperature higher than the crystallizing temperature, followed by cooling the thin film to a temperature lower than the crystallizing temperature, the first period being longer than a second period during which the thin film has a temperature higher than the crystallizing temperature.

According to a third aspect of the present invention, there is provided a method of forming a thin film on a target substrate, the thin film being formed of a material selected from the group consisting of metal oxides, metal nitrides and metals, the method comprising:

depositing a thin film in an amorphous state by CVD on the target substrate;
placing the target substrate having the thin film deposited thereon on a work table arranged within an airtight process chamber;
performing a reforming process for removing organic impurities from the thin film by supplying a process gas containing oxygen atoms into the process chamber and heating over a first period the thin film formed on the target substrate placed on the work table to a first temperature lower than a crystallizing temperature of the material while exhausting the process chamber; and
performing a crystallizing process for crystallizing the thin film after the reforming process by heating the thin film formed on the target substrate placed on the work table to a second temperature higher than the crystallizing temperature, followed by cooling the thin film to a temperature lower than the crystallizing temperature, the first period being longer than a second period during which the thin film has a temperature higher than the crystallizing temperature.

According to a fourth aspect of the present invention, there is provided a method of forming a thin film on a target substrate, the thin film including a first layer and a second layer formed of a material selected from the group consisting of metal oxides, metal nitrides and metals, the method comprising:

depositing a first layer in an amorphous state by CVD on the target substrate;
performing a reforming process for removing organic impurities contained in the first layer by heating the first layer to a temperature lower than a crystallizing temperature of the material within an atmosphere containing active oxygen atoms;
depositing a second layer in an amorphous state by CVD on the first layer having being reformed;
placing the target substrate having the second layer deposited thereon on a work table arranged within an airtight process chamber;
performing a reforming process for removing organic impurities contained in the second layer by supplying a process gas containing oxygen atoms into the process chamber and by heating over a first period the second layer deposited on the target substrate placed on the work table to a first temperature lower than the crystallizing temperature; and
performing a crystallizing process for crystallizing the first and second layers after the reforming process of the second layer by heating the first and second layers deposited on the target substrate placed on the work table to a second temperature higher than the crystallizing temperature, followed by cooling the first and second layers to a temperature lower than the crystallizing temperature, the first period being longer than a second period during which the first and second layers have a temperature higher than the crystallizing temperature.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2D are cross-sectional views collectively showing a thin film forming method according to one embodiment of the present invention;

FIGS. 5A to 5D are cross-sectional views collectively showing a thin film forming method according to another embodiment of the present invention;

DETAILED DESCRIPTION OF THE INVENTION

Figure 1:
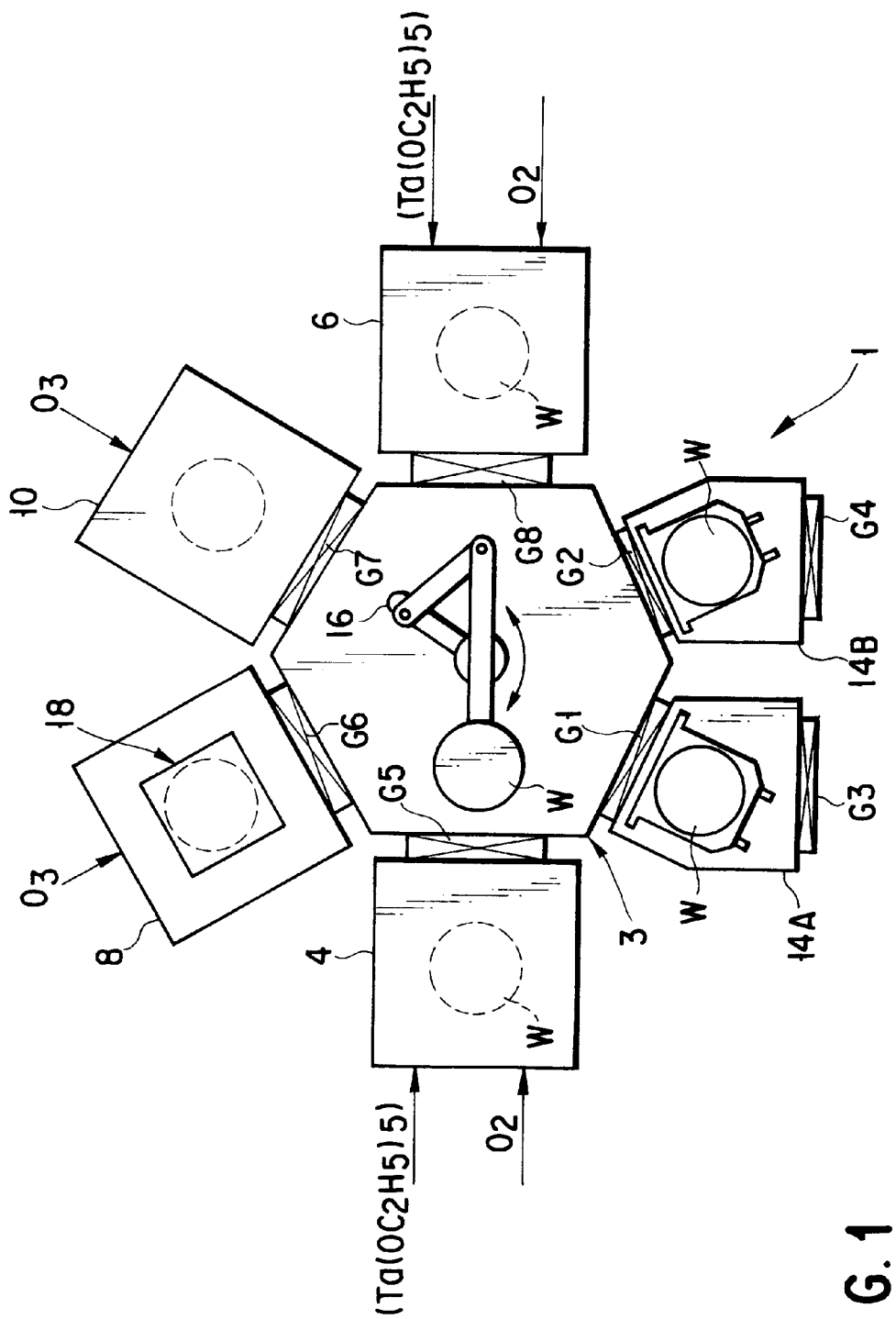
FIG. 1 schematically shows the constitution of the main part of a cluster-tool-type film forming system according to one embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 schematically shows the constitution of the main part of a cluster-tool-type film forming system 1 according to one embodiment of the present invention.

In the film forming system 1 shown in FIG. 1, two CVD apparatuses 4 and 6, a reforming apparatus 8 and a heat processing apparatus 10 are connected to a common transfer chamber 3. Further, two cassette chambers 14A and 14B are also connected to the common transfer chamber 3 for improving the wafer transfer efficiency. A wafer is transferred among these apparatuses 4, 6, 8, 10 and the cassette chambers 14A, 14B through the common transfer chamber 3. For transferring the wafer, an arm mechanism 16 consisting of a multi-joint arm that can be elongated, shrunk and swingable is arranged within the common transfer chamber 3.

The common transfer chamber 3 is connected to the cassette chamber 14A via a gate valve G1 and to the cassette chamber 14B via a gate valve G2. The cassette chambers 14A and 14B are provided with gate doors G3 and G4, respectively, that can be opened or closed to allow the inner spaces of the cassette chambers 14A, 14B to communicate with the outer working environment. Further, the common transfer chamber 3 is connected to the CVD apparatuses 4, 6, the reforming apparatus 8, and the heat processing apparatus 10 via gate valves G5, G6, G7 and G8, respectively.

Each of the common transfer chamber 3 and the cassette chambers 14A and 14B is of an airtight structure. The cassette chambers 14A and 14B constitute the wafer load/unload of the entire film forming system. A cassette C housing a plurality of semiconductor wafers is transferred into and taken out of each of the cassette chambers 14A and 15B through the gate doors G3 and G4 that are opened. Each of the cassette chambers 14A and 14B is provided with a cassette stage (not shown) that can be moved in a vertical direction and swung. Further, these cassette chambers 14A, 14B can be vacuum-exhausted with the cassette C housed therein.

Each of the CVD apparatuses 4 and 6 is used for forming an amorphous metal oxide film on a target substrate, e.g., a semiconductor wafer, under a vacuum atmosphere containing an evaporated metal oxide film raw material and an oxidizing gas. The reforming apparatus 8 is used for subjecting a metal oxide film to a reforming process by exposing the metal oxide film to active oxygen atoms under a vacuum atmosphere. Further, the heat processing apparatus 10 is used for subjecting a metal oxide film successively to a reforming process and to a crystallizing process by heating the metal oxide film to a temperature higher than the crystallizing temperature.

Each of the apparatuses 4, 6, 8, 10 and the cassette chambers 14A and 14B is connected to a gas supply mechanism (not shown) for purging the inner spaces with an inert gas, e.g., $N_2$ gas, and to a vacuum exhaust mechanism (not shown) for vacuum-exhausting the inner spaces. The $N_2$ gas supply to these apparatuses 4, 6, 8, 10 and the cassette chambers 14A, 14B and the vacuum exhaust of these apparatuses 4, 6, 8, 10 and the cassette chambers 14A, 14B can be controlled independently of each other.

The CVD apparatus and the reforming apparatus disclosed in Jpn. Pat. Appln. KOKAI Publication No. 10-79377 (U.S. patent application Ser. No. 08/889,590, the teachings of which are hereby incorporated by reference) can be used as the CVD apparatuses 4, 6 and as the reforming apparatus 8. In each of these CVD apparatuses 4 and 6, an amorphous metal oxide film, e.g., a tantalum oxide ($Ta_2O_5$) film, is deposited on the surface of a wafer by CVD. As a raw material of the metal oxide film, an organic compound of a liquid metal alkoxide, e.g., $Ta(OC_2H_5)_5$, which is bubbled by, for example, a He gas, is supplied to the CVD apparatus. The process gas is mixed with $O_2$ gas used as an oxidizing gas within the process chamber so as to carry out a CVD film forming reaction under the particular atmosphere. Two CVD apparatuses of the same constitution are used in the present invention so as to improve the through-put. It is possible to use as an oxidizing gas $O_3$, $N_2O$, NO, a gasified alcohol, etc. in addition to $O_2$.

In the reforming apparatus 8, the surface of the wafer placed on a work table having a heater arranged therein is exposed to active oxygen atoms so as to reform the metal oxide film formed on the wafer surface. The active oxygen atoms are obtained by irradiating ozone ($O_3$) introduced from the outside with ultraviolet rays emitted from a lamp 18 on the ceiling of the apparatus. The active oxygen atoms can also be obtained by using $N_2O$ gas in place of ozone. The organic impurities having C—C bonds or hydrocarbons contained in the metal oxide film are decomposed by the active oxygen atoms so as to be removed from the metal oxide film. The reforming process should be carried out at a temperature lower than the crystallizing temperature of the metal oxide film in order to remove the organic impurities completely from the metal oxide film.

In the heat processing apparatus 10, the wafer is heated in the presence of active oxygen atoms from a temperature not higher than the crystallizing temperature to a temperature not lower than the crystallizing temperature of the metal oxide film. As a result, a reforming process of the metal oxide film formed as the uppermost layer of the wafer and a crystallizing process of all the metal oxide films formed on the wafer are carried out successively. The reforming process and the crystallizing process may be carried out substantially simultaneously by heating the wafer in the presence of active oxygen atoms.

Figure 7:
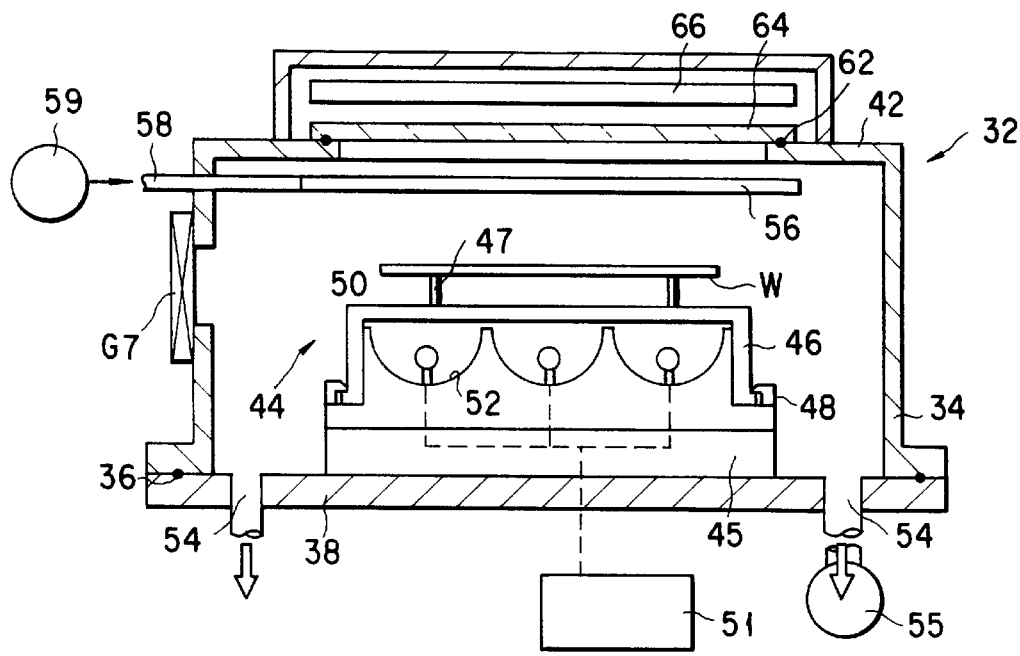
FIG. 7 schematically shows the constitution of the main part of the heat processing apparatus included in the film forming system shown in FIG. 1.

FIG. 7 schematically shows the constitution of the main part of an apparatus 32 used as the heat processing apparatus 10 of the film forming system shown in FIG. 1.

As shown in FIG. 7, the heat processing apparatus 32 comprises a process chamber 34 made of, for example, aluminum having the surface covered with anodized aluminum. A bottom plate 38 is airtightly arranged in a bottom portion of the process chamber 34 using a seal member 36 such as an O-ring.

A work table 44 on which a semiconductor wafer is placed is arranged within the process chamber 34. The work table 44 comprises a base 45 and a cover 46 removably mounted onto the base 45 via a clamp 48. The cover 46 is made of a transparent quartz, and a plurality of pins 47 made of quartz are arranged on the cover 46 for supporting a wafer W. An airtight space separated from the atmosphere within the process chamber 34 is formed between the base 45 and the cover 46.

A plurality of heating lamps 50 consisting of, for example, halogen lamps are arranged within the airtight space of the work table 44. The wafer W is heated from the back side by the lamps 50. The power supply to the lamps 50 can be controlled individually by a controller 51, making it possible to set the temperature of the wafer W and the metal oxide film formed on the wafer W at an optional desired value. A reflective mirror 52 that is substantially elliptical or parabolic in cross section is arranged below the lamp 50 so as to permit the back surface of the wafer W to be efficiently irradiated with light radiated from the lamp 50.

A plurality of exhaust ports 54 connected to a vacuum exhaust mechanism 55 are formed in the bottom plate 38 of the process chamber 34. The vacuum exhaust mechanism 55 makes it possible to exhaust the process chamber 34 and to set up a vacuum condition within the process chamber 34. A gate valve G7 that is opened when the wafer W is transferred into and out of the process chamber 34 is formed in the side wall of the process chamber 54. Also, a shower head 56 is arranged above the work table 44 to face the work table 56. The shower head 56 is connected to a gas source 59 of a process gas ($O_2$ or $O_3$) through a line 58 extending through the side wall of the process chamber 54.

Figure 8:
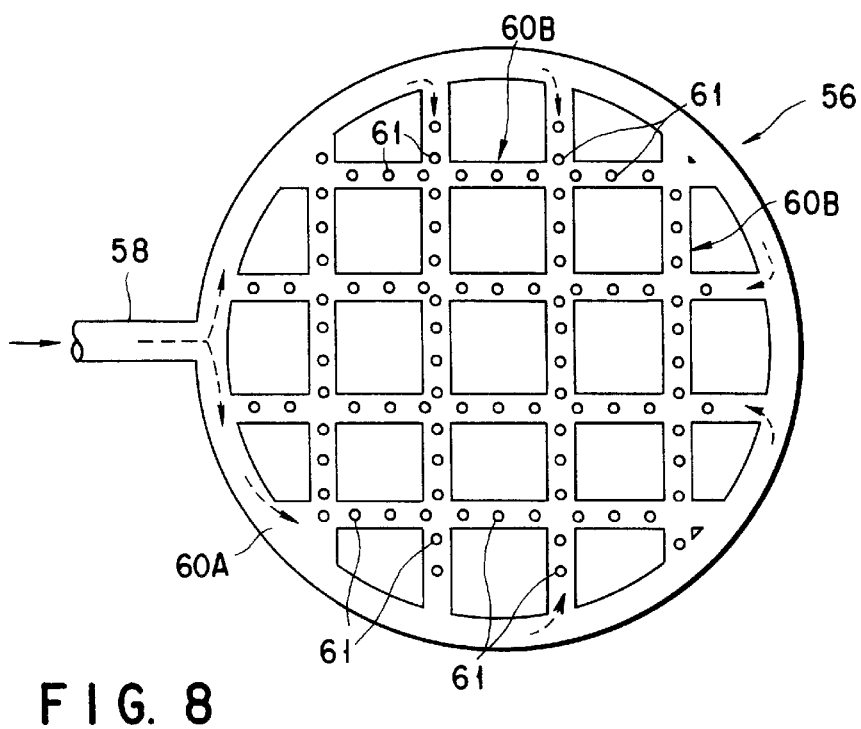
FIG. 8 is a plan view showing the shower head of the apparatus shown in FIG. 7.

The shower head 56 has a lattice shape as shown in FIG. 8. To be more specific, the shower head 56 includes a ring pipe 60A connected to a line pipe 58 and an inside pipe 60B connected inside the ring pipe 60A and arranged to form a lattice. A large number of gas spurting holes 61 are equidistantly formed on the lower side of the inside pipe 60B.

An opening having a diameter larger than that of the wafer W is formed in the ceiling plate 42 of the process chamber 34. A window 64 made of a transparent quartz is airtightly arranged to close the opening via a seal member 62 such as an O-ring. A large number of ultraviolet lamps 66 are arranged above the window 64. Ultraviolet rays having a wavelength of, for example, 254 nm are emitted from the ultraviolet lamp 66 to allow the process gas and the target surface of the wafer W to be irradiated with the ultraviolet rays through the window 64. As a result, active oxygen atoms are generated from the process gas.

Figure 9:
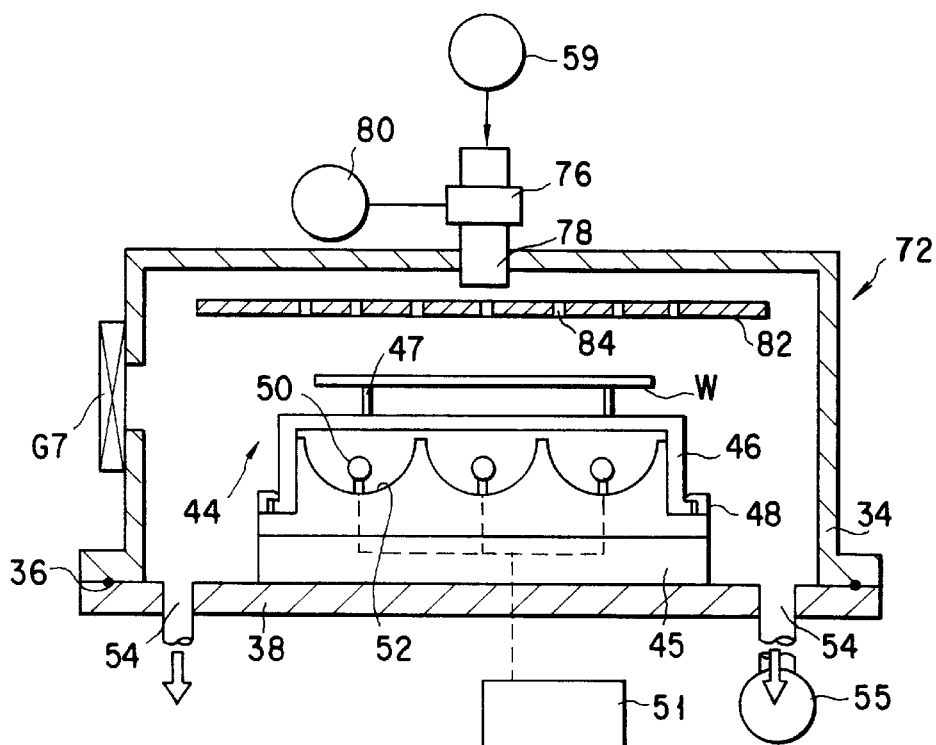
FIG. 9 schematically shows the constitution of the main part of a heat processing apparatus according to another embodiment of the present invention.

FIG. 9 schematically shows the constitution of the main part of a heat processing apparatus 72, which may be used as the heat processing apparatus 10, according to another embodiment of the present invention. As shown in the drawing, the heat processing apparatus 72 comprises a process chamber 74 made of, for example, aluminum having the surface covered with anodized aluminum. The shower head 56, the window 64 and the ultraviolet lamp 66 as shown in FIG. 7 are not arranged in the heat processing apparatus 72. In place of the particular constitution employed in the apparatus shown in FIG. 7, a nozzle 78 connected to a gas source 59 of a process gas ($O_2$) via a plasma cavity 76 is connected to the ceiling plate 42 of the process chamber 74. In the plasma cavity 76, the process gas is converted into a plasma by application of the power of a microwave power source 80. As a result, active oxygen atoms are supplied from the nozzle 78 into the process chamber 72. A distributing plate 82 having a large number of apertures 84 is arranged to face the nozzle 78, with the result that active oxygen atoms are uniformly distributed on the surface of the wafer.

A film forming method of the present invention is carried out as follows by using the film forming system 1 shown in FIG. 1. The following description covers the case where a thin metal oxide film of a double layer structure is formed as an insulating film.

Let us describe first the overall flow of, for example, an 8 inch wafer. Specifically, a cassette C housing, for example, 25 unprocessed wafers is placed on a cassette stage (not shown) within the first cassette chamber 14A. Then, the gate door G3 is closed to establish an inert gas atmosphere consisting of $N_2$ gas within the first cassette chamber 14A. At the same time, the chamber 14A is vacuum-exhausted.

Then, the gate valve G1 is opened to permit the cassette chamber 14A to communicate with the common transfer chamber 3 evacuated in advance to set up an inert gas atmosphere. Then, the wafer W is transferred from the cassette chamber 14A into the common transfer chamber 3 by the arm mechanism 16.

Then, the wafer W is transferred through the opened gate valve G5 into the first CVD apparatus 4 evacuated in advance. Within the first CVD apparatus 4, a metal oxide film, e.g., tantalum oxide ($Ta_2O_5$) film, is deposited as a first layer of an insulating thin film. After completion of the deposition step of the first layer, the wafer W is transferred from the first CVD apparatus 4 into the common transfer chamber 3 maintained at vacuum, by using the arm mechanism 16.

Then, the wafer W is transferred through the opened gate valve G6 into the reforming apparatus 8 evacuated in advance. A reforming process is carried out within the reforming apparatus 8. Specifically, organic impurities such as hydrocarbons and C—C bonds, which are contained in the first tantalum oxide layer formed on the wafer surface, are removed by using the ultraviolet rays emitted from the ultraviolet irradiating means 18 and ozone.

After completion of the reforming process, the wafer W is transferred from the reforming apparatus 8 into the common transfer chamber 3 maintained at vacuum, by using the arm mechanism 16. Then, the wafer W is transferred through the opened gate valve G8 into the second CVD apparatus 6 evacuated in advance. Within the second CVD apparatus 6, a second tantalum layer is deposited under the same conditions as in the film formation within the first CVD chamber 4.

After completion of the depositing step of the second layer, the wafer W is transferred from the second CVD apparatus 6 into the common transfer chamber 3 maintained at vacuum, by using the arm mechanism 16. Then, the wafer W is transferred through the opened gate valve G7 into the heat processing apparatus 10 evacuated in advance. Within the heat processing apparatus 10, the wafer having the first and second tantalum layers formed thereon is heated under an atmosphere including ultraviolet rays and ozone to a low temperature, such as 450° C., to perform a reforming process, and then heated to a temperature not lower than the crystallizing temperature of tantalum oxide, followed by lowering the temperature in 60 seconds. As a result, a reforming process of the second tantalum oxide layer and a crystallizing process of the first and second tantalum layers are performed successively. After completion of the crystallizing step, the processed wafer is transferred into the common transfer chamber 3 and, then, housed in the cassette C arranged within the second cassette chamber 14B.

Let us describe each of the process steps described above with reference to FIGS. 2A to 2D.

First, a first tantalum oxide film 20 is formed as a metal oxide film in a predetermined thickness on the wafer W within the first CVD apparatus 4, as shown in FIG. 2A. In this step, the raw material gas is supplied by bubbling a liquid metal alkoxide of $Ta(OC_2H_5)$ with a He gas. At the same time, an oxidizing gas such as $O_2$ gas is supplied to the reaction system. The supply rate of the metal alkoxide, which depends on the film forming rate, is, for example, about several mg/min.

The process pressure of the CVD process is about 0.2 to 0.3 Torr, and the process temperature should be set to fall within a range of 250 to 450° C., e.g., 400° C. In this case, the first tantalum oxide film 20 is deposited in a thickness t1 of, for example, 3.5 to 5.0 nm. The first tantalum oxide layer 20 as deposited is in an amorphous state. Since an organic material is used as a raw material in forming the first tantalum oxide layer 20, it is unavoidable for the first layer 20 to contain organic impurities.

Then, the wafer W is transferred into the reforming apparatus 8 for applying a reforming process to the first tantalum oxide layer 20. In this reforming process, an oxidizing gas, e.g., ozone, is used as a process gas serving to provide active oxygen atoms, and the first layer 20 is irradiated with a large amount of ultraviolet rays emitted from the ultraviolet irradiating means 18, as shown in FIG. 2B. As a result, the ozone is excited by irradiation with the ultraviolet rays so as to generate a large amount of active oxygen atoms. It should be noted that the active oxygen atoms serve to oxidize the organic impurities contained in the first tantalum oxide layer 20 formed on the surface of the wafer W. At the same time, the C—C bonds, etc. of the organic impurities are broken by the energy of the ultraviolet rays so as to decompose the organic impurities. As a result, the organic impurities contained in the first tantalum oxide layer 20 can be removed substantially completely.

In this reforming process, the first tantalum oxide layer 20 is irradiated with a large amount of the ultraviolet rays having a wavelength of mainly 185 nm and 254 nm. Also, the process pressure is set to fall within a range of about 1 to 600 Torr, and the process temperature is set at 600° C., which is the crystallizing temperature of tantalum oxide, or less. To be more specific, the process temperature is set to fall within a range of 320 to 600° C., e.g., about 425° C. Where the process temperature is lower than 320° C., the processed first tantalum oxide layer 20 fails to exhibit a sufficiently high insulating breakdown voltage. On the other hand, if the process temperature is higher than 600° C., the first tantalum oxide layer 20 begins to be crystallized, resulting in failure to achieve a sufficient reformation. Also, the reforming time, which depends on the film thickness, should desirably be at least 10 minutes. Incidentally, where the thickness t1 of the first tantalum oxide layer 20 is smaller than 4.5 nm, the reforming process can be performed by the ozone supply alone without employing the ultraviolet irradiation.

After completion of the reforming process, the wafer W is transferred into the second CVD apparatus 6 for depositing a second tantalum oxide layer 22 on the first tantalum oxide layer 20, as shown in FIG. 2C. The depositing conditions of the second layer 22 such as the kind of the raw material gas, the flow rate of the raw material gas, the process pressure, and the process temperature are exactly equal to those for deposition of the first layer 20. The thickness t2 of the second layer 22 is set equal to the thickness t1 of the first layer 20, i.e., 3.5 to 5.0 nm. At the time when deposition of the second layer 22 is finished, each of the first and second tantalum oxide layers 20 and 22 is in an amorphous state.

Then, the wafer W is transferred into the heat processing apparatus 10 for the processes described below. Specifically, a process gas, e.g., ozone, is supplied into the heat processing apparatus 10 as a source of active oxygen atoms as in the reforming process described above, and the process pressure is set to fall within a range of about 1 to 600 Torr, as shown in FIG. 2D. On the other hand, the process temperature is varied across the crystallizing temperature of tantalum oxide. The temperature of the wafer W including the first and second tantalum oxide layers 20 and 22 (hereinafter simply referred to as the wafer temperature) is controlled by allowing a controller 51 shown in FIG. 7 to adjust the electric power supply to each of the lamps 50.

First the temperature of the wafer is set lower than the crystallizing temperature (700° C.) of the tantalum oxide and, preferably, is set at a first temperature lower than the upper limit (600° C.) of the reforming temperature in order to apply a reforming process to the second tantalum oxide layer 22. Then, the wafer temperature is rapidly elevated to a second temperature higher than the crystallizing temperature so as to apply a crystallizing process to the first and second tantalum oxide layers 20 and 22, followed by promptly cooling the wafer to a temperature lower than 600° C. It should be noted that the period during which the wafer temperature is maintained at the first temperature is longer than the period during which the wafer temperature is held higher than the crystallizing temperature.

By the particular process, the second tantalum oxide layer 22 constituting the uppermost metal oxide layer is subjected to a reforming process until the wafer temperature is elevated to reach the crystallizing temperature. It should also be noted that, when the wafer temperature exceeds 700° C., all the tantalum layers including the first tantalum layer 20 and the second tantalum layer 22 are crystallized. What should be noted is that, in the present invention, the reforming process of the second tantalum oxide layer 22 constituting the uppermost layer and the crystallizing process of the first and second tantalum oxide layers 20 and 22 are carried out successively within the same chamber.

Figure 3:
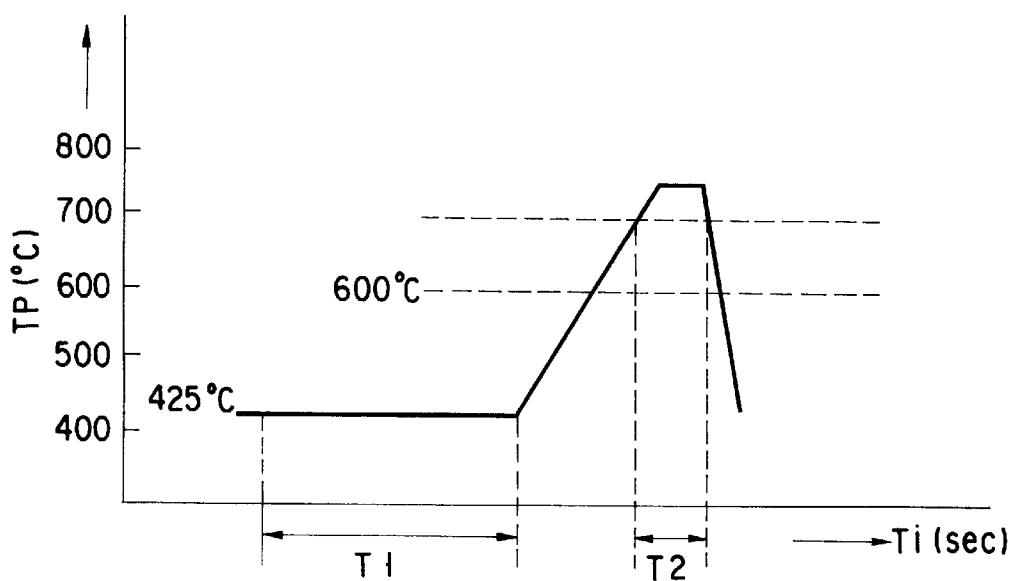
FIG. 3 is a graph showing changes in the process temperature in a heat processing apparatus.

FIG. 3 is a graph showing the changes in the process temperature of the heat processing apparatus 10. In the graph of FIG. 3, time Ti (sec) is plotted on the abscissa, with the process temperature TP(°C.) being plotted on the ordinate. As shown in FIG. 3, the wafer W is transferred into the process chamber 34 (see FIG. 7) under the condition that each of the wafer temperature and the temperature within the process chamber 34 is set at about 450° C. A reforming process is carried out by maintaining the set temperature for a predetermined period of time, e.g., for about 2 minutes. Then, the power supply to the lamps 50 is increased so as to rapidly increase the wafer temperature to a level not lower than 700° C., e.g., 750° C. In this case, the temperature should be elevated at a rate of 30 to 130° C./sec, e.g., 100° C./sec. Before the wafer temperature is elevated to reach about 600° C., a reforming process is applied to the second tantalum oxide layer 22. Also, in the temperature region exceeding 700° C., a crystallizing process is applied to the first and second tantalum oxide layers 20 and 22.

There is a gap of about 100° C. between the upper limit (600° C.) of the reforming temperature and the crystallizing temperature (700° C.) of the tantalum oxide layer. This is because the crystallization does not take place instantly when a certain temperature level is exceeded, but proceeds gradually over a certain temperature range. To be more specific, the second tantalum oxide layer 22 is reformed and, at the same time, the first and second tantalum oxide layers 20 and 22 are gradually crystallized so as to perform both the reforming process and the crystallizing process simultaneously when the wafer temperature is elevated from 600° C. to 700° C.

In this case, the reforming time T1 of the tantalum oxide layer 22, which depends on the thickness of the tantalum oxide layer 22, should be about 120 seconds when the second tantalum oxide layer 22 has a thickness of about 4.5 nm. On the other hand, the crystallization takes place instantly. Therefore, the time t2 during which the wafer temperature is not lower than 700° C., should be set at, for example, about 60 seconds. It is desirable for the crystallizing temperature to fall within a range of 700 to 800° C. If the wafer temperature is higher than 800° C., the underlying substance under the tantalum oxide layer is oxidized so as to increase the effective film thickness. Also, a serious thermal effect is given to the semiconductor device so as to deteriorate the characteristics of the semiconductor device. After the crystallizing process, the process chamber 34 is purged with $N_2$ gas, followed by lowering the temperature within the process chamber to about 425° C. Further, the pressure within the process chamber 34 is adjusted, followed by taking the processed wafer out of the heat processing apparatus 10.

As described previously, the step shown in FIG. 2D can be carried out by using ozone alone without employing the ultraviolet irradiation. However, it is of course possible to apply the ultraviolet (UV) irradiation for promoting the reforming process as in the step shown in FIG. 2B. In addition, the ultraviolet irradiation permits further promoting the reforming process of the second tantalum oxide layer 22 so as to shorten the reforming time T1 shown in FIG. 3. Even in this case, however, the period during which the wafer temperature is maintained at the reforming temperature is longer than the period during which the wafer temperature is held higher than the crystallizing temperature.

Evaluated were the insulating properties of the insulating film consisting of the first and second tantalum oxide films 20 and 22, which was prepared by the method of the present invention, and the insulating film consisting of the first and second tantalum oxide films, which was prepared by the conventional method in which each reforming process and each crystallizing process were carried out quite independently of each other.

Figure 4:
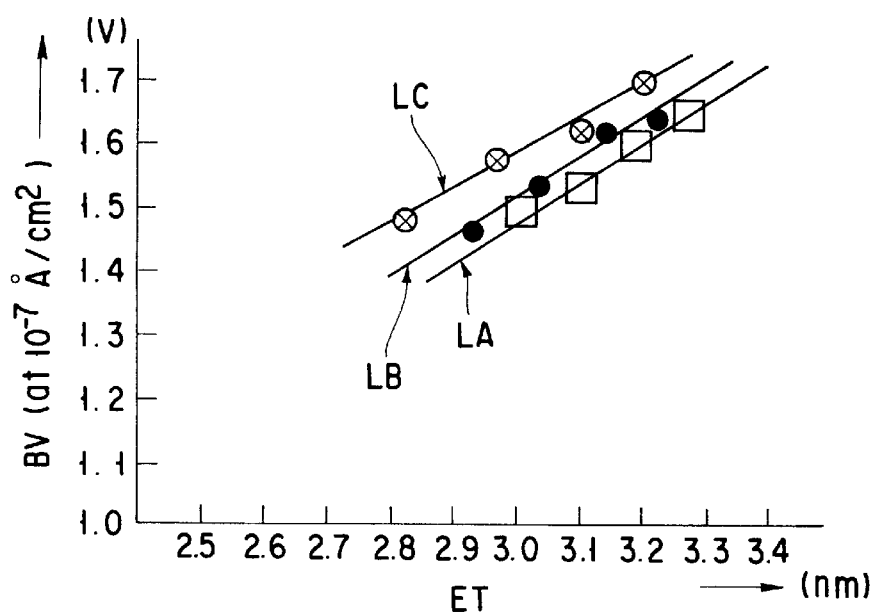
FIG. 4 is a graph showing the insulation breakdown characteristics of a tantalum oxide film.

FIG. 4 is a graph showing the results of the experiment. In the graph of FIG. 4, the effective film thickness ET is plotted on the abscissa, with the insulation breakdown voltage BV being plotted on the ordinate. Line LA shown in FIG. 4 denotes the properties of the insulating film prepared by the conventional method. On the other hand, line LB denotes the properties of the insulating film prepared by the method of the present invention, in which ozone alone was used without employing the ultraviolet irradiation. Further, line LC shown in FIG. 4 denotes the properties of the insulating film prepared by the method of the present invention, in which the ultraviolet irradiation and ozone were both employed.

As shown in FIG. 4, the insulating films prepared by the method of the present invention exhibit insulation breakdown voltages slightly higher than that exhibited by the insulating film prepared by the conventional method. What should be noted is that the number of process steps employed in the method of the present invention is smaller by one than that employed in the conventional method. Nevertheless, the insulating films prepared by the method of the present invention exhibit insulating properties better than those exhibited by the insulating film prepared by the conventional method. What should also be noted is that the insulation breakdown voltage can be further increased by employing both ozone and the ultraviolet irradiation, as denoted by line LC.

In the method shown in FIGS. 2A to 2D, the tantalum oxide layers 20 and 22 are set at the same thickness, i.e., at about 3.5 to 5.0 nm. However, it is also possible to make the thickness t1 of the first tantalum oxide layer 20 somewhat larger than 4.5 nm, as shown in FIGS. 5A to 5D. For example, the thickness t1 can be set at 5.5 to 6.0 nm. By contraries, the thickness t2 of the second tantalum oxide layer 22 can be made somewhat smaller than 4.5 nm. For example, the thickness t2 of the second tantalum oxide layer 22 can be set at 2.5 to 4.0 nm. In this case, the decrease in the thickness of the second tantalum oxide layer 22 makes it possible to perform the reformation promptly. It follows that, in the step shown in FIG. 5D, the thin tantalum oxide layer 22 can be reformed sufficiently in a short time by only the process with ozone without employing the ultraviolet irradiation. In other words, the reforming time T1 shown in FIG. 3 can be shortened.

Figure 6A:
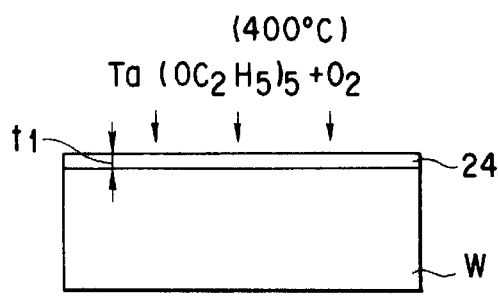
FIGS. 6A and 6B are cross-sectional views collectively showing a thin film forming method according to still another embodiment of the present invention.
Figure 6B:
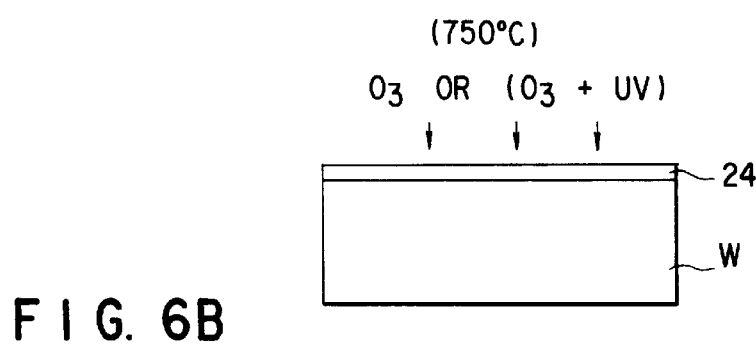

In the embodiment described above, the tantalum oxide insulating film is of a two-layer structure. However, it is possible to form a tantalum oxide layer 24 as a single layer as shown in FIGS. 6A and 6B. In this case, the tantalum oxide layer 24 is deposited in a predetermined thickness as shown in FIG. 6A, followed by applying a reforming and crystallizing process to the tantalum oxide layer 24, as shown in FIG. 6B. As already described in conjunction with FIG. 2D, the tantalum oxide layer 24 is subjected to the reforming process and the crystallizing process substantially simultaneously. It also suffices to determine whether to use ozone alone or both the ozone and the ultraviolet irradiation depending on the thickness of the tantalum oxide layer 24. In this case, two or three process steps can be omitted, compared with the conventional method, while maintaining sufficiently high insulation breakdown properties of the insulating film.

Figure 10:
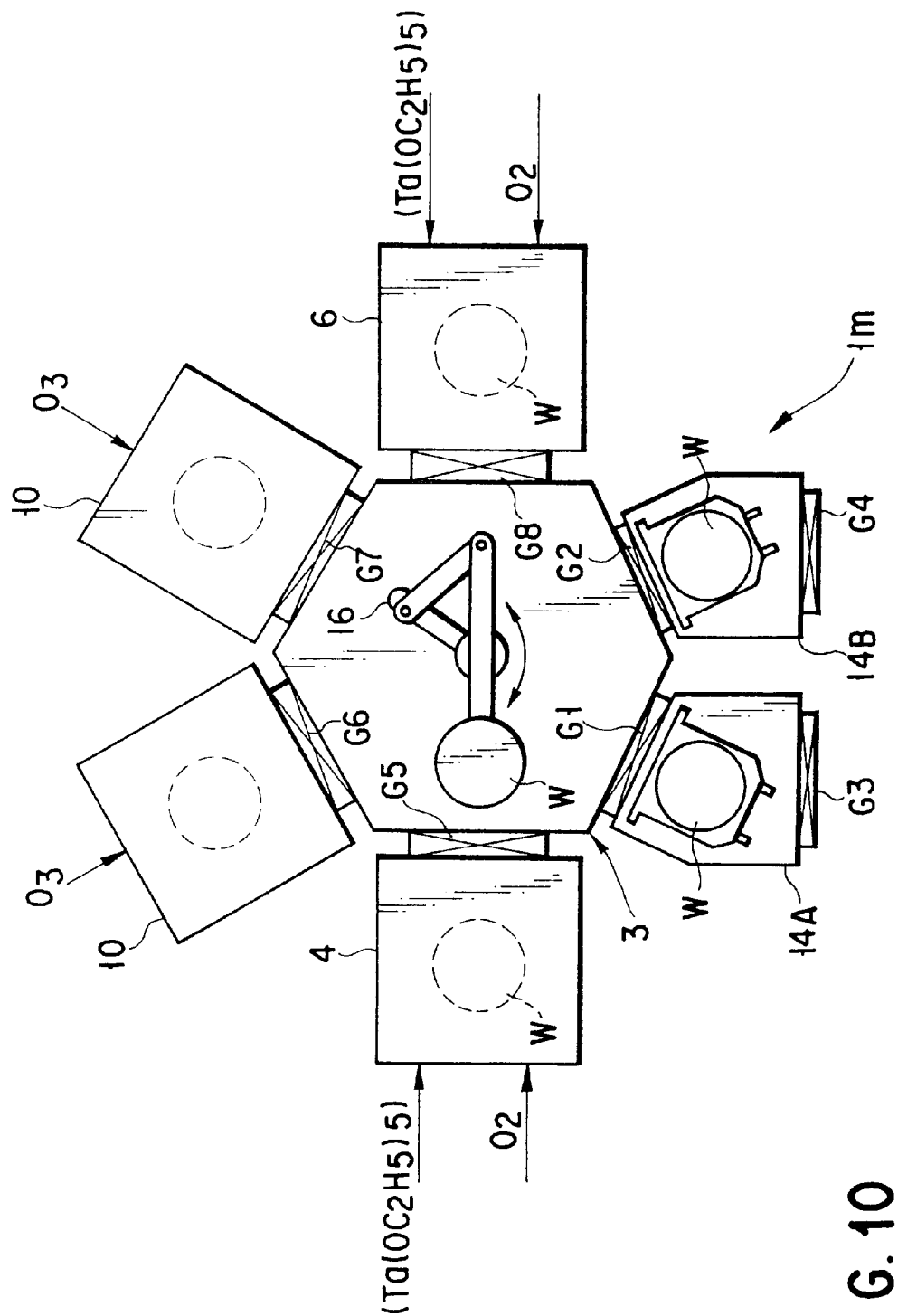
FIG. 10 schematically shows the constitution of the main part of a cluster-tool-type film forming system according to another embodiment of the present invention.

FIG. 10 schematically shows the constitution of the main part of a cluster-tool-type film forming system according to another embodiment of the present invention.

The film forming system 1M shown in FIG. 10 differs from the film forming system 1 shown in FIG. 1, in that it has no reforming apparatus 8, but has two heat processing apparatuses 10. Using the film forming system 1M shown in FIG. 10, a thin metal oxide film of a double layer structure can be formed by the following method in which a reforming process and a crystallizing process of each layer are successively performed.

First, a cassette C housing, for example, 25 unprocessed wafers is placed on a cassette stage (not shown) within the first cassette chamber 14A. Then, the gate door G3 is closed to establish an inert gas atmosphere consisting of $N_2$ gas within the first cassette chamber 14A. At the same time, the chamber 14A is vacuum-exhausted.

Then, the gate valve G1 is opened to permit the cassette chamber 14A to communicate with the common transfer chamber 3 evacuated in advance to set up an inert gas atmosphere. Then, the wafer W is transferred from the cassette chamber 14A into the common transfer chamber 3 by the arm mechanism 16.

Then, the wafer W is transferred through the opened gate valve G5 into the first CVD apparatus 4 evacuated in advance. Within the first CVD apparatus 4, a metal oxide film, e.g., tantalum oxide ($Ta_2O_5$) film, is deposited as a first layer of an insulating thin film. After completion of the deposition step of the first layer, the wafer W is transferred from the first CVD apparatus 4 into the common transfer chamber 3 maintained at vacuum, by using the arm mechanism 16.

Then, the wafer W is transferred through the opened gate valve G6 into one of the heat processing apparatuses 10 evacuated in advance. Within this one of the heat processing apparatuses 10, the wafer having the first tantalum layer formed thereon is heated under an atmosphere including ultraviolet rays and ozone to a low temperature, such as 450° C., to perform a reforming process of the first tantalum oxide layer, and then heated to a temperature not lower than the crystallizing temperature of tantalum oxide, followed by lowering the temperature in 60 seconds. As a result, reforming and crystallizing processes of the first tantalum oxide layer are performed successively.

After completion of the processes within this one of the heat processing apparatuses 10, the wafer is transferred into the common transfer chamber 3 maintained at vacuum, by using an arm mechanism 16. Then, the wafer W is transferred through the opened gate valve G8 into the second CVD apparatus 6 evacuated in advance. Within the second CVD apparatus 6, a second tantalum layer is deposited under the same conditions as in the film formation within the first CVD chamber 4.

After completion of the depositing step of the second layer, the wafer W is transferred from the second CVD apparatus 6 into the common transfer chamber 3 maintained at vacuum, by using the arm mechanism 16. Then, the wafer W is transferred through the opened gate valve G7 into the other of the heat processing apparatuses 10 evacuated in advance. Within the other of the heat processing apparatuses 10, the wafer having the first and second tantalum layers formed thereon is heated under an atmosphere including ultraviolet rays and ozone to a low temperature, such as 450° C., to perform a reforming process of the second tantalum oxide layer, and then heated to a temperature not lower than the crystallizing temperature of tantalum oxide, followed by lowering the temperature in 60 seconds. As a result, reforming and crystallizing processes of the second tantalum oxide layer are performed successively. After completion of the processes within the other of the heat processing apparatuses 10, the processed wafer is transferred into the common transfer chamber 3 and, then, housed in the cassette C arranged within the second cassette chamber 14B.

It should be noted that, even with the film forming system 1M shown in FIG. 10, a program can be set such that only a reforming process of a first tantalum oxide layer is performed within one of the heat processing apparatuses 10, and a reforming process of a second tantalum oxide layer and a crystallizing process of the first and second tantalum oxide layers are performed within the other of the heat processing apparatuses 10, as described with reference to the film forming system 1 shown in FIG. 1.

Figure 11:
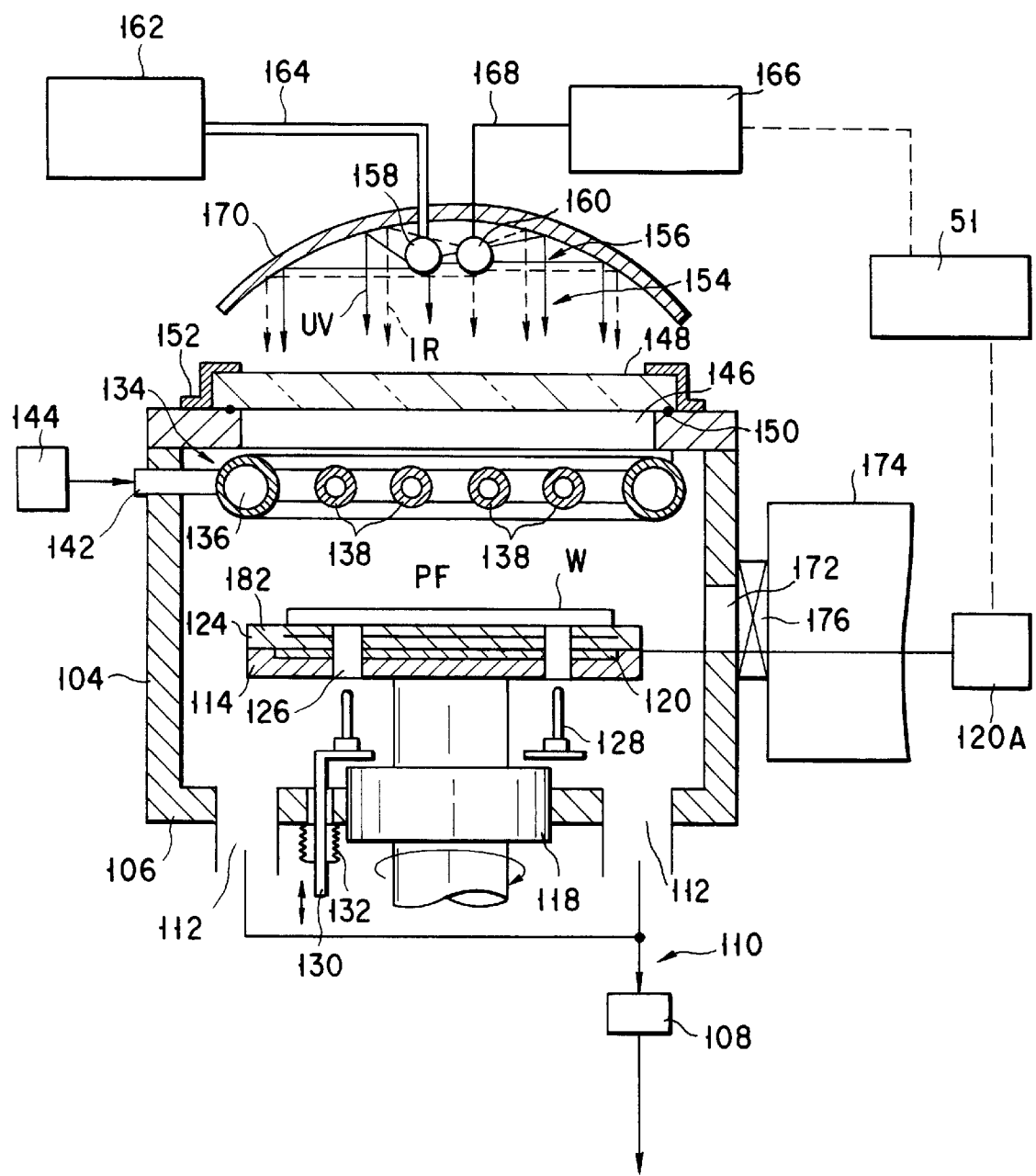
FIG. 11 schematically shows the constitution of the main part of a heat processing apparatus according to still another embodiment of the present invention.

FIG. 11 schematically shows the constitution of the main part of a heat processing apparatus 102 according to still another embodiment of the present invention. The constitution shown in FIG. 11 can be used as the main part of any of the reforming apparatus 8 and the heat processing apparatus 10 included in the film forming system shown in FIGS. 1 and 10.

The heat processing apparatus 102 comprises a process chamber 104 made of aluminum having the surface covered with anodized aluminum and shaped like a substantially rectangular box, as shown in the drawing. A plurality of exhaust ports 112 are formed in the peripheral portion of a bottom portion 106 of the process chamber 104. A vacuum exhaust mechanism 110 including a vacuum pump 108 is connected to the exhaust port 112 so as to make it possible to vacuum-exhaust the inner space of the process chamber 104.

A port 172 is formed in the side wall of the process chamber 104. A load lock chamber 174 that can be vacuum-exhausted is connected to the port 172 with a gate valve 176 interposed therebetween. The semiconductor wafer W is transferred into the process chamber 104 through the load lock chamber 174. Also, an $N_2$ gas supply mechanism (not shown) for the purging purpose is connected to each of the process chamber 104 and the load lock chamber 174.

A disc-like work table 114 made of a nonconductive material, e.g., alumina, is arranged within the process chamber 104. The semiconductor wafer W as a target substrate can be placed on the work table 114. The central portion in the lower surface of the work table 114 is supported by the tip of a hollow rotary shaft 116 vertically extending through the bottom portion 106 of the process chamber 104. A magnetic fluid seal 118 is arranged in the portion where the rotary shaft 116 extends through the bottom portion 106 of the process chamber 104. The rotary shaft 116 is airtightly and rotatably supported by the seal 118, and the work table 114 can be rotated, as desired. Incidentally, the rotary shaft 116 is rotated by a driving force generated from a rotating motor (not shown).

A resistance heater 120 made of carbon and coated with, for example, SiC is embedded in the work table 114 so as to heat the semiconductor wafer W placed thereon to a desired temperature. A thin electrostatic chuck 124 made of a ceramic material is arranged on the work table 114. An electrode 122 formed of a copper plate or the like is buried in the electrostatic chuck 124. The wafer W is pulled by Coulomb's force generated from the electrostatic chuck 124 so as to be supported on the upper surface of the work table 114.

A plurality of holes 126 are formed in peripheral portions of the work table 114 such that these holes 126 extend through the work table 114 in a vertical direction. Also, lifter pins 128 are arranged to be movable in a vertical direction through these holes 126. These lifter pins 128 are moved together in a vertical direction by a pin driving rod 130 that can be moved in a vertical direction through the bottom portion 106 of the process chamber 104. A shrinkable bellows 132 made of a metal is arranged in that portion of the bottom portion 106 through which the rod 130 extends so as to permit the rod 130 to be moved in a vertical direction while maintaining an airtight state. When the wafer W is transferred into and out of the process chamber 104, the wafer W is moved upward or downward by a lift mechanism (not shown) via the lifter pins 128. In general, three lifter pins 128 are arranged in a manner to support peripheral portions of the wafer W.

A shower head 134 made of a heat resistant material that is transparent to ultraviolet rays and infrared rays such as quartz is formed in a ceiling portion of the process chamber 104. A process gas is spurted through the shower head 134 into a process field PF.

The shower head 134 is shaped like a lattice like the shower head 56 shown in FIG. 8. To be more specific, the shower head 134 comprises an annular pipe 136 connected to a line pipe 142 and having a diameter larger than the diameter of the wafer W and inside pipes 138 connected inside the annular pipe 136. A large number of gas spurting holes 61 as shown in FIG. 8 are equidistantly formed on the lower side of the inside pipes 138. The inner diameters of the annular pipe 136 and the inside pipe 138 are set at about 16 mm and 4.35 mm, respectively. Also, the diameter of the gas spurting hole 61 is set at about 0.3 to 0.5 mm.

It is desirable for the projected surface area of the inside pipes 138 on the wafer W placed on the work table 114 to be smaller than 20% of the area of the wafer surface. In this case, the wafer surface can be irradiated directly with light rays, which are to be described later, running through the clearances of the lattice of the inside pipes 138. However, if the shower head 134 is transparent to ultraviolet rays and infrared rays, the constitution of the shower head 134 is not limited to that shown in the drawing and described above.

The line pipe 142 for introducing a process gas into the shower head 134 airtightly extends through the side wall of the process chamber so as to be led to the outside. The line pipe 142 is connected to a gas source 144 via a mass flow controller (not shown). A process gas such as ozone gas is introduced into the shower head 134 through the line pipe 142.

A rectangular aperture 146 set larger than the wafer diameter is formed in a ceiling portion of the process chamber 104. A rectangular transmitting window 148 made of a material transparent to ultraviolet rays and infrared rays such as quarts is airtightly mounted in the rectangular aperture 146 by a fixing frame 152 using a seal member 150 such as an O-ring. The rectangular transmitting window 148 has a thickness of, for example, 20 mm to enable the window 148 to withstand the atmospheric pressure.

A light radiating mechanism 156 for radiating light rays 154 toward the process chamber 104 is arranged above the transmitting window 148. The process gas of ozone is irradiated with the light rays 154 so as to generate active oxygen atoms.

To be more specific, the light radiating mechanism 156 includes mainly a substantially spherical mercury-sealed lamp 158 having mercury sealed therein for emitting ultraviolet rays UV and a substantially spherical infrared lamp 160 for emitting infrared rays IR. A microwave generating mechanism 162 for generating a microwave of, for example, 2.45 GHz is connected to the mercury-sealed lamp 158 via a waveguide 164. On the other hand, a power source 166 is connected to the infrared lamp 160 via a lead wire 168.

As described herein later, the infrared lamp 160 is used for heating a metal oxide film, which is a target substrate. Therefore, the power source 166 of the infrared lamp 160 and the power source 120A of the resistance heater 120 on the side of the work table 114 are controlled by the common temperature controller 51.

A substantially dome-shaped light reflector 170 for reflecting mixed light rays 154 consisting of ultraviolet rays UV and infrared rays IR toward the process field within the process chamber 104 is arranged to cover the upper side of the lamps 158 and 160. The light reflector 170 is prepared by forming, for example, an aluminum plate into a shape of a dome. The curvature of the light reflector 170 is determined to permit the light rays 154 to be reflected substantially uniformly onto the surface of the work table 114.

Let us describe how to carry out a heat process by using the apparatus shown in FIG. 11.

First, the semiconductor wafer W having a metal oxide film such as a tantalum oxide ($Ta_2O_5$) film formed thereon as an insulating film is introduced from the load lock chamber 174 through the port 172 into the process chamber 104 held at a vacuum condition. Then, the wafer W is placed on the work table 114 so as to be attracted and held on the work table 114 by Coulomb's force of the electrostatic chuck 124.

The wafer W is maintained at a predetermined process temperature by the resistance heater 120. Also, a predetermined process pressure is maintained within the process chamber 104 by supplying a process gas containing ozone into the process field PF through the shower head 134 while vacuum-exhausting the process chamber 104. Under this condition, a reforming process or both reforming process and crystallizing process are started as described previously with reference to the film forming system shown in FIG. 1.

During the process, a microwave of 2.45 GHz is generated from the microwave generating mechanism 162 included in the light radiating mechanism 156 so as to allow the mercury-sealed lamp 158 to be irradiated with the microwave through the waveguide 164. As a result, a large amount of ultraviolet rays are emitted from the mercury-sealed lamp 158. At the same time, a large amount of infrared rays IR are generated from the infrared lamp 160 by the electric power supplied from the power source 166. The light rays 154 containing both the ultraviolet rays UV and the infrared rays IR are reflected directly by the dome-shaped light reflector 170, and the reflected light is transmitted through the transmitting window 148 made of quartz so as to enter the process chamber 104 maintained at a predetermined vacuum pressure. Further, the light rays 154 pass through the shower head 134 made of quartz so as to have the process gas containing ozone as a main component irradiated with the light rays 154 within the process field PF.

Ozone is irradiated with the ultraviolet rays UV so as to generate a large amount of active oxygen atoms. The active oxygen atoms act on the metal oxide film so as to dissociate organic impurities such as C—C bonds and hydrocarbons contained in the metal oxide film so as to reform the metal oxide film. In this step, the surface of the wafer W is particularly heated by the infrared rays IR, with the result that the atoms in the crystal lattice of the metal oxide film are vigorously vibrated thermally. As a result, removal of the organic impurities are promoted when the active oxygen atoms act on the metal oxide film.

Since the inner space of the process chamber 104 is held at a vacuum condition or at a state of reduced pressure, the probability of collision of the generated active oxygen atoms against gaseous atoms or gaseous molecules is very low. In addition, since the light rays 154 are less likely to be absorbed by gaseous molecules, the density of the active oxygen atoms is increased so as to perform the processing promptly. By this processing, the insulating properties of the metal oxide film can be markedly improved rapidly.

As described previously, the dome-shaped light reflector 170 of the light radiation mechanism 156 is set to have an appropriate curvature to permit the reflected light to be distributed substantially uniformly on the surface of the work table 114. As a result, the generated ultraviolet rays UV and the infrared rays IR can be utilized efficiently for generation of the active oxygen atoms.

During the heat process described above, the work table 114 supported by the rotary shaft 116 is rotated together with the wafer W placed on the table 114. As a result, the wafer can be processed uniformly over the entire surface, and the metal oxide film formed on the wafer can be processed substantially uniformly over the entire surface.

The process pressure should be set to fall within a range of 1 to 600 Torr, e.g., at about 30 Torr. Where the process pressure does not fall within the range noted above, the heat process proceeds slowly or cannot be performed sufficiently, with the result that the insulation breakdown voltage of the metal oxide film is lowered. On the other hand, the process temperature should be set to fall within a range of 320 to 600° C., e.g., at about 425° C., in the case of the reforming process, and should be set to fall within a range of 700 to 800° C., e.g., 750° C., in the case of the crystallizing process.

The process gas such as ozone introduced into the shower head 134 flows first through the annular pipe 136 and, then, into the inside pipes 138. Then, the process gas is supplied into the process chamber 104 through a large number of the spurting holes 61 made in the inside pipes 138. The particular arrangement makes it possible to supply the process gas uniformly to the wafer surface.

A large amount of the ultraviolet rays UV and the infrared rays IR pass through the free spaces formed between the adjacent inside pipes 138 arranged to form a lattice in the shower head 134. Accordingly, the ultraviolet rays UV and the infrared rays IR do not interfere with ozone or the like, with the result that the surface of the wafer is irradiated directly with a large amount of the ultraviolet rays UV and the infrared rays IR. Naturally, the amount of the active species is increased on the wafer surface so as to make it possible to perform the process efficiently.

Since a large amount of an electric power can be supplied to the mercury-sealed lamp 158, ultraviolet rays having wavelengths of mainly 185 nm and 254 nm, which contribute to activation of the gas, are emitted in a large amount from the mercury-sealed lamp 158. Also, if an excimer lamp that emits ultraviolet rays having a wavelength not longer than 180 nm, which further contribute to the activation of the gas, in a large amount is used in place of the mercury-sealed lamp 158, the process can be expected to be carried out light sources, i.e., the mercury-sealed lamp 158 and the infrared lamp 160, are used as the light radiation mechanism 156. Alternatively, it is possible to use a lamp that emits light having wavelengths falling within the ultraviolet ray range and within the infrared ray range, e.g., a light-emitting lamp of an electrodeless microwave system, can be used in place of the light radiation mechanism 156. The light-emitting lamp of an electrodeless microwave system emits light rays of both the ultraviolet and infrared ranges as well as the visible light range, making it possible to decrease the number of lamps used. It follows that it is possible to decrease the running cost and the initial cost.

In the embodiment shown in FIG. 11, the mercury-sealed lamp 158 of a large capacity and the infrared lamp 160 of a large capacity are fixed within the heat processing apparatus. Alternatively, it is possible to use lamps having a medium capacity or small capacity. In this case, the semiconductor wafer W is scanned with the light rays 154 emitted from these lamps.

Figure 13:
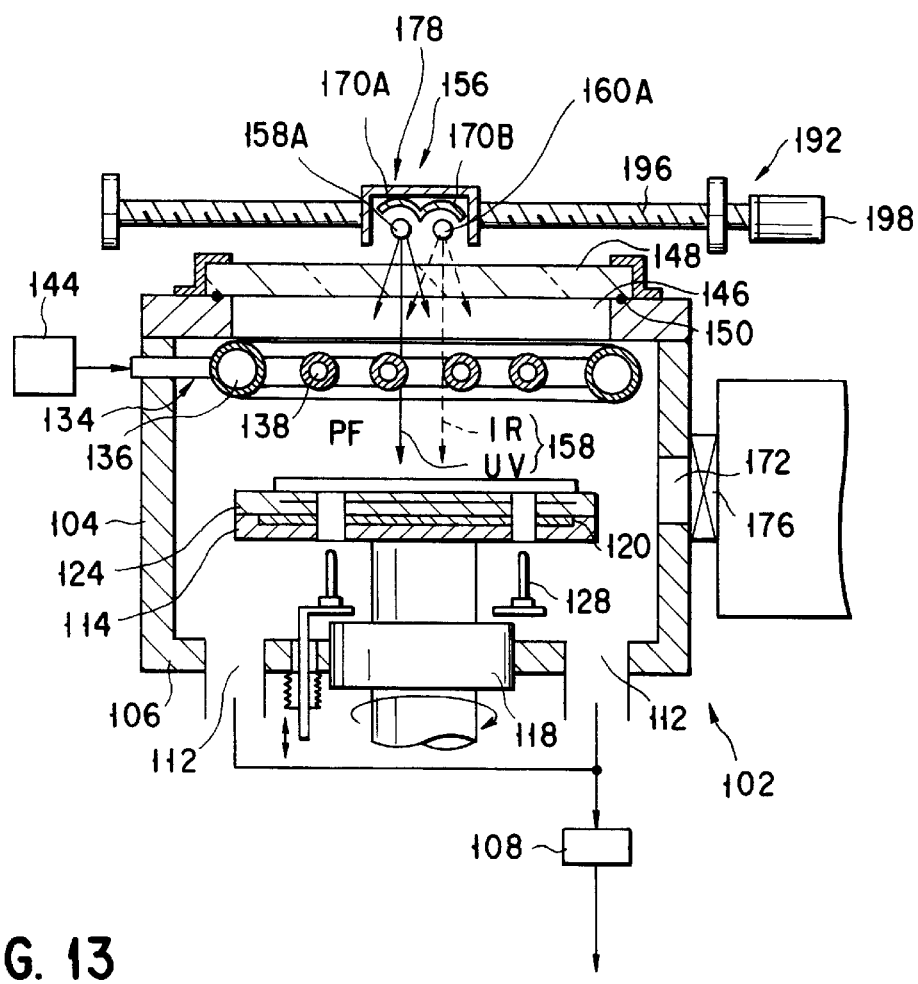
FIG. 13 schematically shows the constitution of the main part of a heat processing apparatus according to still another embodiment of the present invention.
Figure 14:
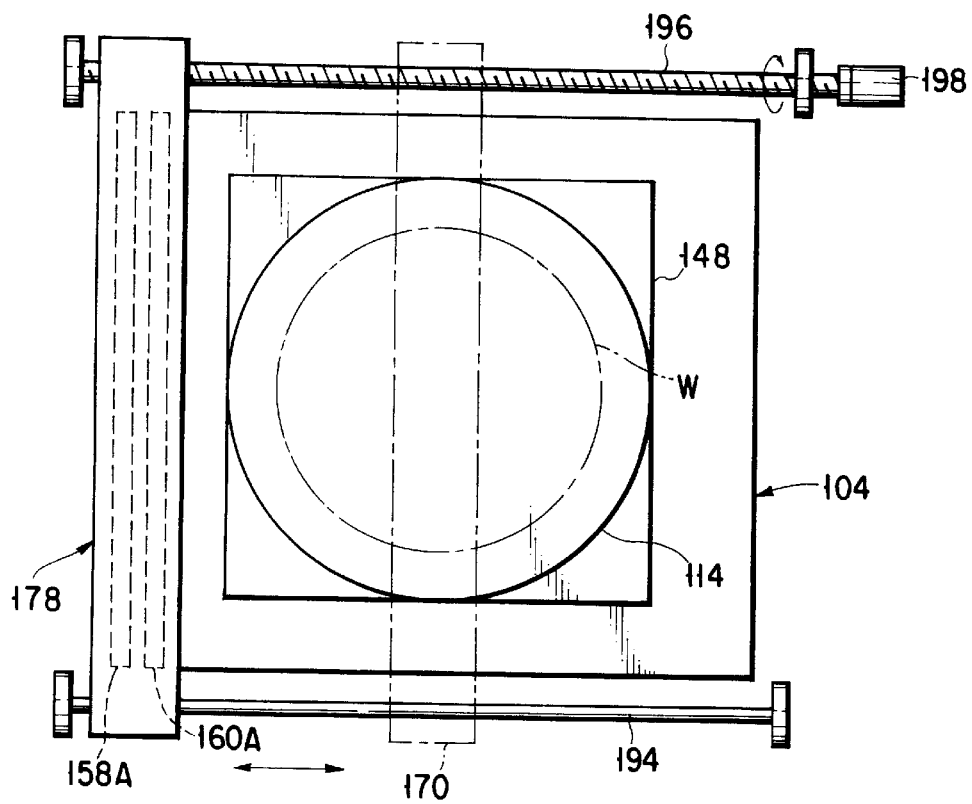
FIG. 14 is a top view schematically showing the apparatus shown in FIG. 13.

FIG. 13 schematically shows the constitution of the main part of a heat processing apparatus according to still another embodiment of the present invention. FIG. 14 is a top view schematically showing the apparatus shown in FIG. 13.

As shown in FIG. 13, a slender rod-like mercury-sealed lamp 158A and a slender rod-like infrared lamp more promptly. It is possible to use $O_2$ gas, $N_2O$ gas, etc. as an additive gas to ozone contained in the process gas.

A comparative experiment was carried out between a conventional method in which ultraviolet rays alone were used for a reforming process and a method of the present invention in which ultraviolet rays and infrared rays were used for a reforming process. Each of the reforming processes was carried out under the temperature of 425° C., the pressure of 30 Torr, the $O_2$ flow rate of 10 slm, the $O_3$ concentration of 130 g/m³, and the process time of 30 seconds.

Figure 12:
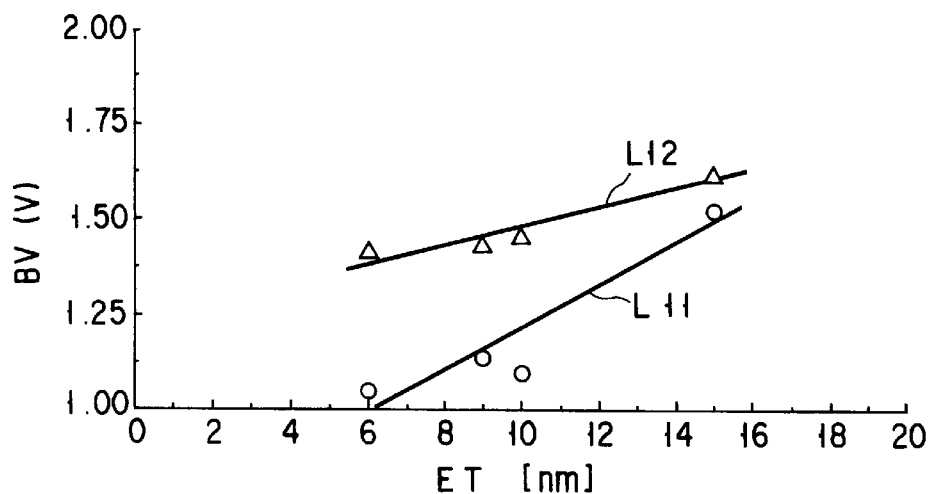
FIG. 12 is a graph comparing the prior art in which reformation is carried out by ultraviolet rays alone with the method of the present invention in which reformation is carried out by using both ultraviolet rays and an infrared light.

FIG. 12 is a graph showing the results of the experiment. In the graph of FIG. 12, the effective film thickness ET is plotted on the abscissa, with the insulation breakdown voltage BV being plotted on the ordinate. Line L11 shown in the graph represents the conventional method, with line L12 representing the method of the present invention. As apparent from the graph, the method of the present invention is markedly superior to the conventional method in the insulation breakdown voltage of the insulating film. Particularly, the method of the present invention is prominently superior to the conventional in the insulation breakdown voltage of the insulating film where the film thickness is 10 nm or less.

In the embodiment shown in FIG. 11, two different 160A are used in this embodiment as the light radiation mechanism 156. Also, slender light reflectors 170A and 170B each having a substantially arcuate cross-sectional shape are arranged behind these lamps 158A and 160A, respectively, to reflect downward the ultraviolet rays UV and the infrared rays IR with a high directivity.

These lamps 158A and 160A are housed in a casing 178 having a lower open end. The casing 178 is mounted to a scanning mechanism 192 and can be moved in a horizontal direction over the process chamber 104, as shown in FIG. 14. To be more specific, the scanning mechanism 192 comprises a guide rail 194 mounted on one side above the process chamber 104 and a driving rail 196 consisting of, for example, a ball screw, which is arranged on the other side above the process chamber 104. The casing 178 is stretched over these rails 194 and 196 so as to be movable along these rails. A driving motor 198 such as a step motor, which is arranged at one end portion of the driving rail 196, driven in forward and backward directions so as to permit the lamps 158A and 160A to be moved along the rails 194 and 196.

The light rays 154 consisting of the ultraviolet rays UV emitted from the mercury-sealed lamp 158a and infrared rays IR emitted from the infrared lamp 160A scan the surface of the wafer W by the scanning mechanism 192 of the constitution described above. As a result, the metal oxide film formed on the surface of the wafer W is promptly processed efficiently by the light rays 154 consisting of ultraviolet rays UV and infrared rays IR, as already described in conjunction with FIG. 11. Particularly, in this embodiment of the present invention, the metal oxide film can be processed uniformly over the entire surface by allowing the wafer surface to be irradiated and scanned with the light rays 154.

Figure 15:
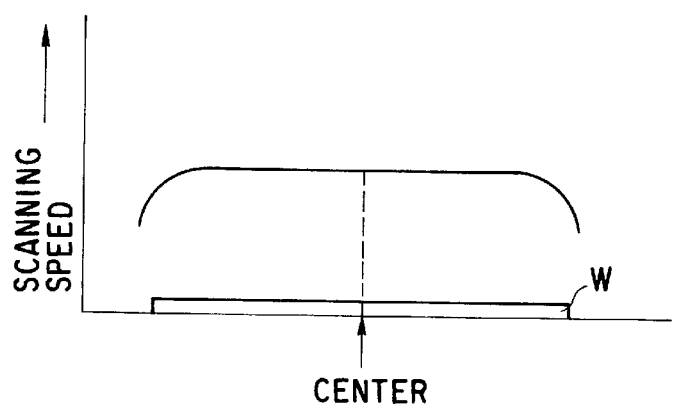
FIG. 15 is a graph showing changes in the scanning speed of light.

It is unavoidable for the light emitted from each of the lamps 158A and 160A to be diffused sideways, though the diffusion amount is small. Therefore, it is considered that the light amount in the edge portion of the wafer is diminished, compared with the central portion of the wafer in the scanning direction. To overcome this difficulty, the scanning speed is slightly lowered in the edge portion on the starting side and in the edge portion on the finishing side of the scanning, as shown in FIG. 15. By lowering the scanning speed, the amount of the irradiating light is increased in the edge portions on the starting side and on the finishing side of the scanning so as to further improve the uniformity of the process over the entire surface of the metal oxide film.

The two lamps 158A and 160A used in this embodiment do not have markedly large capacities, making it possible to markedly decrease the facility cost, compared with the case where a large number of lamps are arranged over the entire ceiling region of the process chamber 104 or with the case where highly powerful lamps are used as shown in FIG. 11.

In the embodiment shown in FIG. 13, the casing 178 including two lamps 158A and 160A is moved for the scanning purpose. Alternatively, the scanning can be performed by moving a reflective mirror that reflects the light emitted from the two lamps toward the wafer W.

Figure 16:
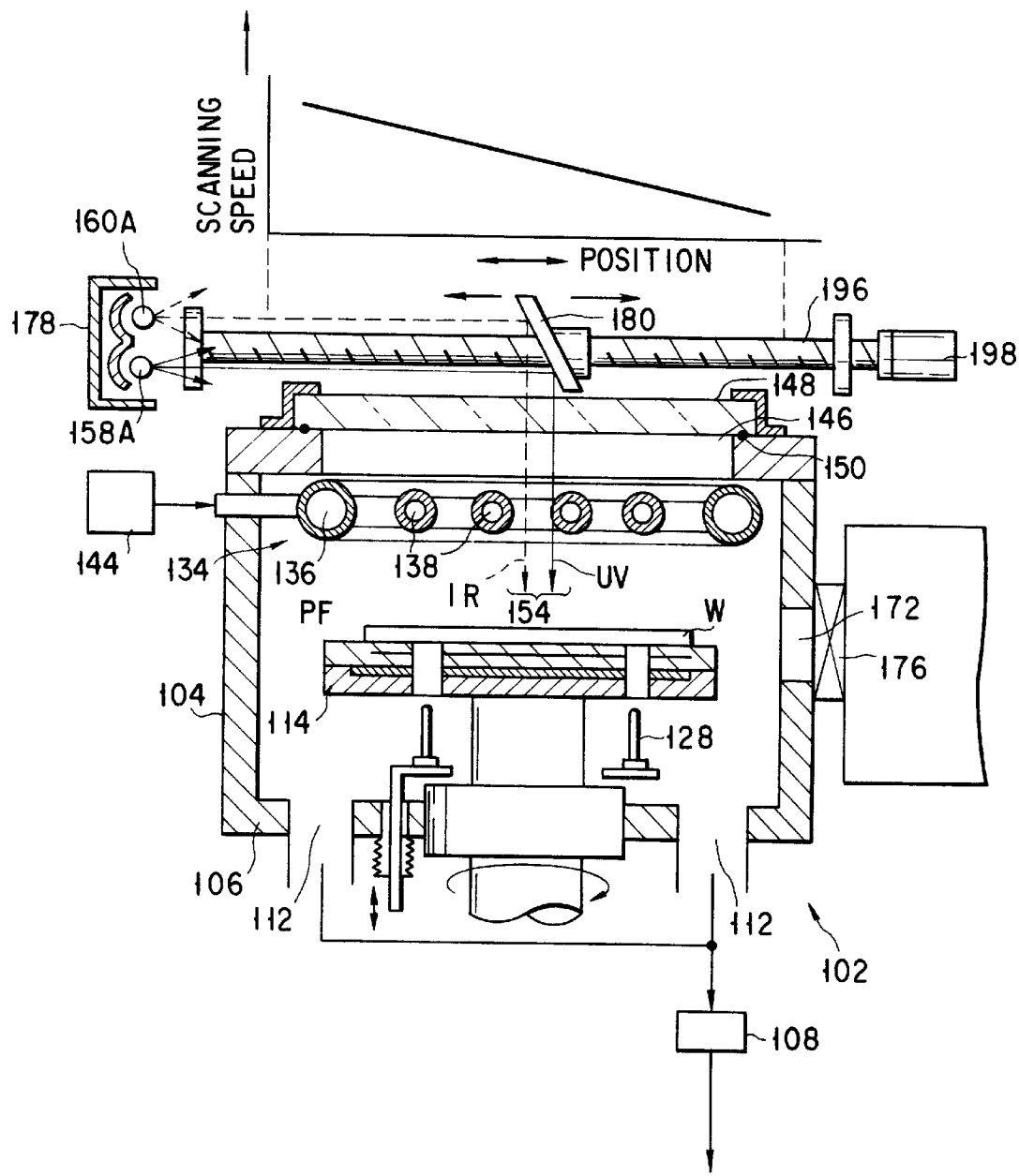
FIG. 16 schematically shows the constitution of the main part of a heat processing apparatus according to still another embodiment of the present invention.

FIG. 16 schematically shows the constitution of the main part of a heat processing apparatus according to still another embodiment of the present invention, which is based on the view point given above.

In this embodiment, a casing 178 provided with a mercury-sealed lamp 158A, an infrared lamp 160A, and light reflectors 170A and 170B is horizontally fixed on one side in an upper region of the ceiling portion of the process chamber 104. Also, a reflective mirror 180 inclined at about 45° relative to a horizontal plane is stretched over the guide rail 194 (see FIG. 14) and the driving rail 196 of the scanning mechanism 192 in a manner to face the casing 178. The reflective mirror 180 is movable along these rails 194 and 196.

The light rays 154 consisting of ultraviolet rays UV and infrared rays IR that are emitted in the horizontal direction from the two lamps 158A and 160A, respectively, are reflected substantially downward by the moving reflective mirror 180 so as to scan the surface of the wafer W. It follows that the metal oxide film formed on the wafer W can be processed promptly and efficiently as in the apparatus shown in FIG. 13. It should also be noted that, since the surface of the wafer W is scanned by the light rays 154, the metal oxide film formed on the wafer can be processed more uniformly over the entire surface.

It should be noted that heavy articles such as the lamps 158A and 160A and the casing 178 are moved in the embodiment shown in FIG. 13. In the embodiment shown in FIG. 16, however, the reflective mirror 180 that is relatively light in weight is moved. It follows that, in the embodiment shown in FIG. 16, the operability can be improved. In addition, the mechanical strength of the scanning mechanism 192 can be reduced.

It should also be noted that, in the embodiment shown in FIG. 16, the amount of the diffused light is increased with increase in the distance of the reflective mirror 180 from the light source lamps 158A and 160a. Therefore, the scanning speed of the reflective mirror 180 is set to be gradually decreased with increase in the distance of the reflective mirror 180 from the light source lamps 158A and 160a, as shown in the graph of the scanning speed given in an upper portion of FIG. 16. As a result, the light amount irradiating the wafer surface is increased with increase in the distance of the reflective mirror 180 from the light source lamps 158A and 160a so as to further improve the uniformity of the process over the entire surface of the metal oxide film formed on the wafer.

In the embodiment shown in FIG. 16, the reflective mirror 180 is moved in the horizontal direction so as to allow the light to scan the wafer surface. Alternatively, it is possible to rotate the reflective mirror for the light to scan the wafer surface.

Figure 17:
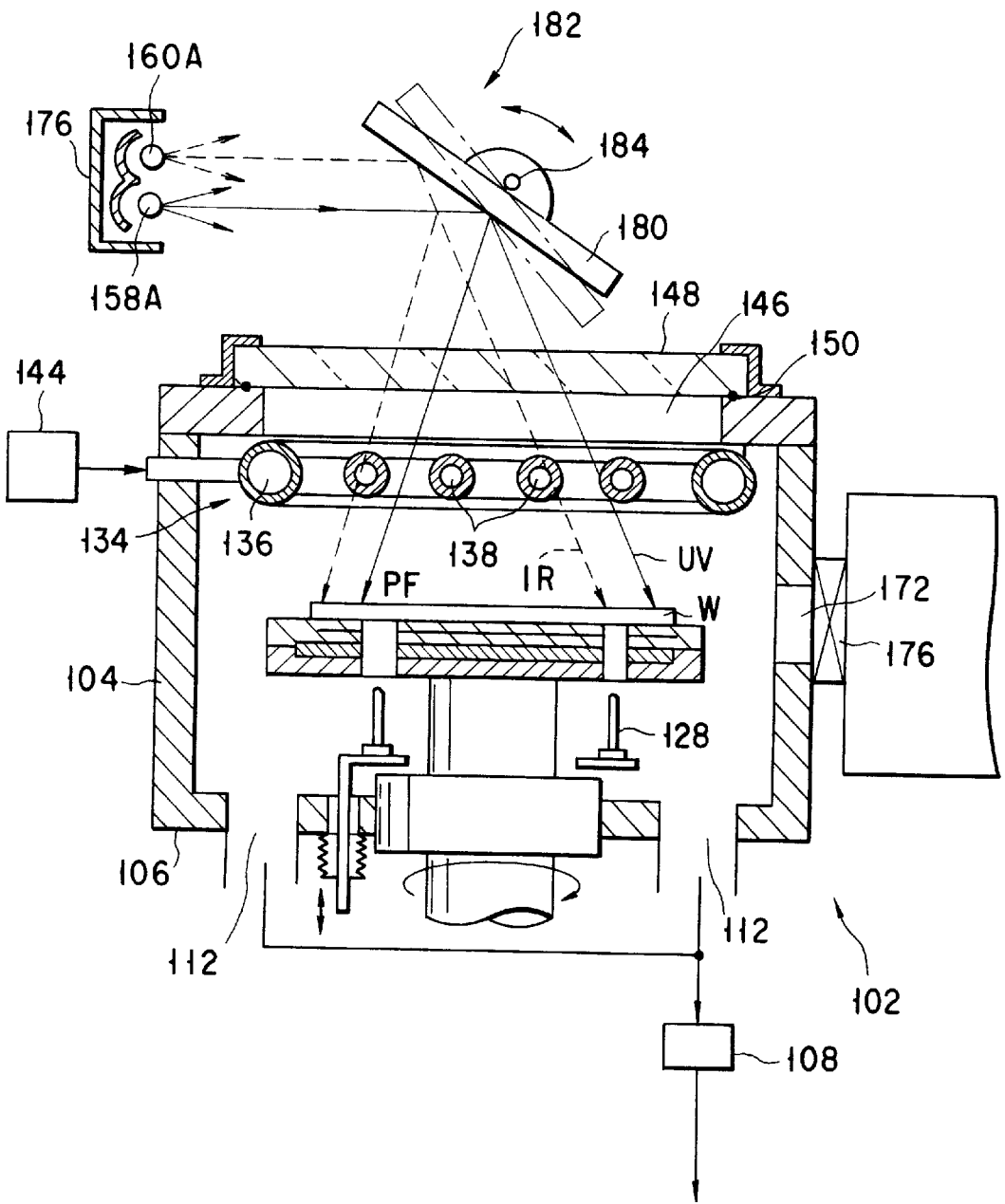
FIG. 17 schematically shows the constitution of the main part of a heat processing apparatus according to still another embodiment of the present invention.

FIG. 17 schematically shows the constitution of the main part of a heat processing apparatus according to still another embodiment of the present invention, which is based on the view point given above.

In this embodiment, a reflective mirror mechanism 182 is arranged in a central portion in an upper region of the ceiling portion of a process chamber 104 in place of the scanning mechanism 192 shown in FIG. 16. To be more specific, the mirror mechanism 182 comprises a slender reflective mirror 180 and a rotary shaft 184 for fixing and integrally rotating the reflective mirror. A driving mechanism such as a step motor (not shown) is arranged at one end of the rotary shaft 184 to permit the reflective mirror 180 to be rotated (or swung) in forward and backward directions within a predetermined range of angles. Also, a casing 178 provided with a mercury-sealed lamp 158A, an infrared lamp 160A, and two reflective mirrors 170A and 170B is horizontally arranged on one side in an upper region of the ceiling portion of the process chamber 104.

The light rays 154 consisting of ultraviolet rays UV and infrared rays IR emitted from the two lamps 158A and 160A, respectively, in the horizontal direction are reflected by the reflective mirror 180 so as to scan the surface of the wafer W. The metal oxide film formed on the semiconductor wafer W can be processed promptly and efficiently in this embodiment, too, as in the embodiment shown in FIG. 16. Also, since the light rays 154 scan the wafer surface, the uniformity of the process over the entire region of the metal oxide film formed on the wafer can be further improved.

What should also be noted is that, in the embodiment shown in FIG. 17, it is unnecessary to use such a large scanning mechanism as used in the embodiments shown in FIGS. 13 and 16, making it possible to simplify the apparatus and, thus, to achieve a low facility cost. It should also be noted that, in the embodiment shown in FIG. 17, the reflective mirror 180 is swung at the highest speed when the reflected light runs vertically downward. Since the length of the optical path is gradually increased so as to gradually increase the amount of the diffused light with increase in the swinging angle of the reflective mirror 180 to the right side or left side, the swinging speed of the reflective mirror 180 is set to be lowered with increase in the swinging angle noted above. As a result, the light amount, which is decreased by the diffusion on the wafer surface, can be compensated so as to further improve the uniformity of the reforming process over the entire surface of the metal oxide film formed on the wafer.

Figure 18:
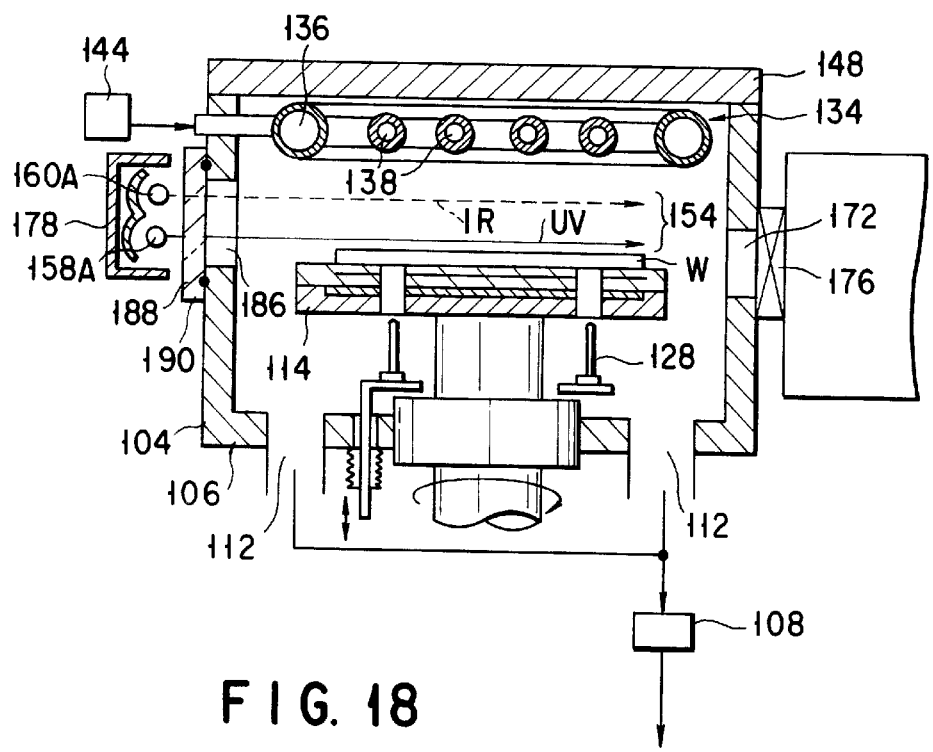
FIG. 18 schematically shows the constitution of the main part of a heat processing apparatus according to still another embodiment of the present invention.
Figure 19:
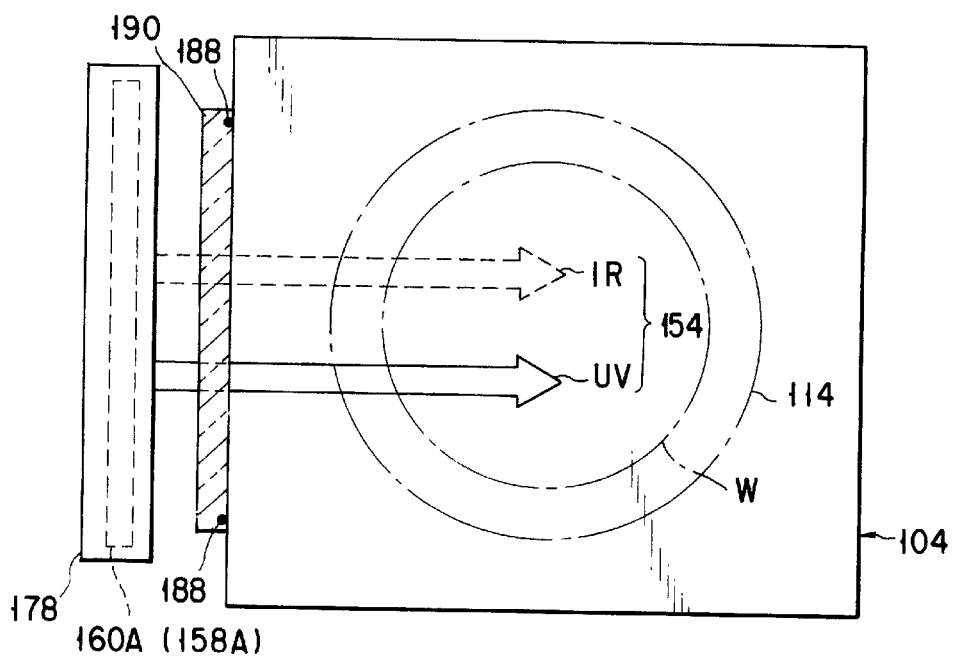
FIG. 19 is a top view schematically showing the apparatus shown in FIG. 18.

FIG. 18 schematically shows the constitution of the main part of a heat processing apparatus according to still another embodiment of the present invention. FIG. 19 is a top view of the apparatus shown in FIG. 18.

In this embodiment, a transmitting window is not formed in the ceiling portion of the process chamber 104, and the entire ceiling portion is formed of, for example, an aluminum plate. An aperture 186 is formed on one side of the process chamber 104, and a slender transmitting window 190 made of the material equal to that used for forming the transmitting window 148 in the embodiment shown in FIG. 11 is arranged at the aperture 186 using a seal member 188. The slender transmitting window 190 is made of, for example, quartz. A casing 178 equipped with two lamps 158A and 160A and two light reflectors 170A and 170B, which is equal to those shown in FIG. 17, etc. is horizontally fixed on the outside of the transmitting window 190. In this case, the casing 178 is arranged to permit the light rays 154 emitted from the lamps 158A and 160A to run in a horizontal direction through the process field PF.

Since the process gas containing ozone is excited by the light rays 154 introduced in a horizontal direction into the process field PF in this case, too, the metal oxide film formed on the surface of the wafer can be processed efficiently. In the embodiment shown in FIG. 18, the lamps 156A and 160A are arranged on the side surface of the process chamber 104, with the result that the light rays 154 need not be transmitted through the portion of the shower head 134 formed in the ceiling portion. Therefore, the light rays 154 emitted from the lamps are less absorbed before the light rays 154 run to reach the process field PF and, thus, a large amount of light rays 154 enter the process field PF. Naturally, the increase in the amount of the light rays 154 entering the process field PF permits promoting the process of the metal oxide film formed on the wafer surface.

It should also be noted that the light amount in a region close to the lamps 158A and 160A is larger than that in a region remote from these lamps 158A and 160A because the light ray is diffused while running within the process field PF. However, since the wafer W is rotated during the process by the rotation of the work table 114, the uniformity of the process can be maintained at a high level over the entire region of the metal oxide film formed on the wafer surface.

In the embodiment shown in each of FIGS. 13 to 19, the resistance heater 120 is used as a heater on the side of the work table 114. However, the heating lamps 50 as shown in FIGS. 7 and 9 can be used in place of the resistance heater 120. Particularly, where the heat processing apparatus of the present invention is used as an apparatus for performing a reforming process and a crystallizing process, it is more desirable to use the heating lamps 50 rather than the resistance heater 120 in view of the heating power.

It should also be noted that the heat processing apparatus shown in each of FIGS. 13 to 18 is featured in that the apparatus can be used not only in the case where both the ultraviolet lamp 158A and the infrared lamp 160A are used but also the case where the ultraviolet lamp 158A alone is used. Each of these lamps need not be limited to a linear lamp. For example, it is also possible to use a lamp folded to present a U-shaped configuration.

In each of the embodiments described above, a tantalum oxide layer is used as a metal oxide film to be processed. However, the heat processing apparatus of the present invention can also be used for processing other films including, for example, metal oxide films such as a titanium oxide film, a zirconium oxide film, a barium oxide film, and a strontium oxide film; metal nitride films such as a titanium nitride film and a tungsten nitride film; and metal films such as a titanium film, a platinum film, a ruthenium film and an iridium film. Further, it is desirable to use ozone or oxygen gas as a process gas in the case of processing a metal oxide film or a metal nitride film. In the case of processing a metal film, however, it is desirable to use an inert gas such as a nitrogen gas, a hydrogen gas, a neon gas, a helium gas or an argon gas as a process gas in place of the ozone gas that is corrosive.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a thin film on a target substrate, said thin film being formed of a material selected from the group consisting of metal oxides, metal nitrides and metals, said method comprising:

depositing a thin film in an amorphous state by CVD on said target substrate;

placing said target substrate having said thin film deposited thereon on a work table arranged within an airtight process chamber;

performing a reforming process for removing organic impurities from said thin film by supplying a process gas containing oxygen atoms into said process chamber and heating over a first period said thin film formed on said target substrate placed on said work table to a first temperature lower than a crystallizing temperature of said material while exhausting said process chamber; and performing a crystallizing process for crystallizing said thin film after said reforming process by heating said thin film formed on said target substrate placed on said work table to a second temperature higher than said crystallizing temperature, followed by cooling said thin film to a temperature lower than said crystallizing temperature, said first period being longer than a second period during which said thin film has a temperature higher than said crystallizing temperature.

2. The method according to claim 1, wherein said process gas is excited during said reforming process to supply active oxygen atoms to said thin film.

3. The method according to claim 2, wherein said process gas is converted into a plasma for generating sail active oxygen atoms.

4. The method according to claim 1, wherein said process gas within said process chamber is irradiated with ultraviolet rays for forming said active oxygen atoms.

5. The method according to claim 4, wherein said thin film is heated during said reforming process and said crystallizing process by heating said target substrate from said work table and by irradiating said thin film with infrared rays on a side opposite to said work table.

6. The method according to claim 5, wherein said ultraviolet rays and said infrared rays are emitted from different lamps.

7. The method according to claim 5, wherein said thin film is scanned with said infrared rays.

8. The method according to claim 1, wherein said thin film is heated from said first temperature to said second temperature at a heating rate of 30 to 100° C./sec.

9. The method according to claim 1, wherein said material consists essentially of tantalum oxide, and said first and second temperatures are 320 to 600° C. and 700 to 800° C., respectively.

10. A method of forming a thin film on a target substrate, said thin film including a first layer and a second layer formed of a material selected from the group consisting of metal oxides, metal nitrides and metals, said method comprising:

depositing a first layer in an amorphous state by CVD on said target substrate;

performing a reforming process for removing organic impurities contained in said first layer by heating said first layer to a temperature lower than a crystallizing temperature of said material within an atmosphere containing active oxygen atoms;

depositing a second layer in an amorphous state by CVD on said first layer having being reformed;

placing said target substrate having said second layer deposited thereon on a work table arranged within an airtight process chamber;

performing a reforming process for removing organic impurities contained in said second layer by supplying a process gas containing oxygen atoms into said process chamber and by heating over a first period said second layer deposited on said target substrate placed on said work table to a first temperature lower than said crystallizing temperature; and performing a crystallizing process for crystallizing said first and second layers after said reforming process of said second layer by heating said first and second layers deposited on said target substrate placed on said work table to a second temperature higher than said crystallizing temperature, followed by cooling said first and second layers to a temperature lower than said crystallizing temperature, said first period being longer than a second period during which said first and second layers have a temperature higher than said crystallizing temperature.

11. A method of forming a thin film on a target substrate, said thin film including a first layer and a second layer formed of a material selected from the group consisting of metal oxides, metal nitrides and metals, said method comprising:

a first step of depositing a first layer in an amorphous state by CVD on said target substrate;

a second step of subjecting said first layer to reforming and crystallizing processes in succession;

a third step of depositing a second layer in an amorphous state by CVD on said first layer having being crystallized; and a fourth step of subjecting said second layer to reforming and crystallizing processes in succession, wherein each of said second and fourth steps comprises:

placing said target substrate on a work table arranged within an airtight process chamber, performing said reforming process by removing organic impurities from respective first and second layers by supplying a process gas containing oxygen atoms into said process chamber and heating over a first period said respective first and second layers formed on said target substrate placed on said work table to a first temperature lower than a crystallizing temperature of said material while exhausting said process chamber, and performing said crystallizing process for crystallizing said respective first and second layers after said reforming process by heating said respective first and second layers formed on said target substrate placed on said work table to a second temperature higher than said crystallizing temperature, followed by cooling said respective first and second layers to a temperature lower than said crystallizing temperature, said first period being longer than a second period during which said respective first and second layers have a temperature higher than said crystallizing temperature.

12. The method according to claim 11, wherein said process gas is excited during said reforming process to supply active oxygen atoms to said respective first and second layers.

13. The method according to claim 12, wherein said process gas is converted into a plasma for generating said active oxygen atoms.

14. The method according to claim 11, wherein said process chamber is irradiated with ultraviolet rays for forming said active oxygen atoms.

15. The method according to claim 14, wherein said respective first and second layers are heated during said reforming process and said crystallizing process by heating said target substrate from said work table and by irradiating said respective first and second layers with infrared rays on a side opposite to said work table.

16. The method according to claim 15, wherein said ultraviolet rays and said infrared rays are emitted from different lamps.

17. The method according to claim 15, wherein said first and second layers are scanned with said infrared rays.

18. The method according to claim 11, wherein said respective first and second layers are heated from said first temperature to said second temperature at a heating rate of 30 to 100° C./sec.

19. The method according to claim 11, wherein said material consists essentially of tantalum oxide, and said first and second temperatures of 320 to 600° C. and 700 to 800° C., respectively.

20. The method according to claim 11, wherein said second and fourth steps are performed in individual process chambers.

* * * * *